(12) United States Patent
Patraw et al.

(10) Patent No.: US 7,179,706 B2
(45) Date of Patent: *Feb. 20, 2007

(54) PERMEABLE CAPACITOR ELECTRODE

(75) Inventors: Robert D. Patraw, Boise, ID (US); Michael A. Walker, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/875,534

(22) Filed: Jun. 24, 2004

(65) Prior Publication Data

US 2005/0048734 A1 Mar. 3, 2005

Related U.S. Application Data

(63) Continuation of application No. 10/651,760, filed on Aug. 29, 2003, now Pat. No. 6,784,069.

(51) Int. Cl.
*H01L 21/8242* (2006.01)
(52) U.S. Cl. ............... 438/253; 438/396; 438/239; 438/257; 438/972; 257/E29.01; 257/E27.47
(58) Field of Classification Search ........ 438/253, 438/396, 239, 257, 972
See application file for complete search history.

(56) References Cited

U.S. PATENT DOCUMENTS

| | | | |
|---|---|---|---|
| 4,430,564 A | 2/1984 | Fischer | |
| 5,480,820 A | 1/1996 | Roth et al. | |
| 6,049,101 A | 4/2000 | Graettinger et al. | |
| 6,146,961 A | 11/2000 | Graettinger et al. | |
| 6,664,158 B2 | 12/2003 | Dehm et al. | |
| 6,784,067 B2* | 8/2004 | Suzuki | 438/393 |
| 2003/0068858 A1 | 4/2003 | Allman et al. | |
| 2004/0171208 A1* | 9/2004 | Gilton | 438/239 |

* cited by examiner

*Primary Examiner*—Asok K. Sarkar
*Assistant Examiner*—Victor V. Yevsikov
(74) *Attorney, Agent, or Firm*—Knobbe, Martens, Olson & Bear, LLP

(57) ABSTRACT

The present teachings describe a container capacitor that utilizes an etchant permeable lower electrode for the formation of single or double-sided capacitors without excessive etching back of the periphery of the use of sacrificial spacers. The present teachings further describe a method of forming at least one capacitor structure on a substrate. For example, the method comprises forming at least one recess in the substrate, depositing a first conductive layer on the substrate so as to overlie the at least one recess, and defining at least one lower electrode within the at least one recess formed in the substrate by removing at least a portion of the first conductive layer. The method further comprises diffusing an etchant through the at least one lower electrode so as to remove at least a portion of the substrate to thereby at least partially isolate the at least one lower electrode. The method still further comprises depositing a dielectric layer on the at least one isolated lower electrode and depositing a second conductive layer on the dielectric layer so as to form an upper electrode.

11 Claims, 15 Drawing Sheets

PERMEABLE CAPACITOR ELECTRODE

RELATED APPLICATIONS

This application is a continuation of U.S. application Ser. No. 10/651,760, filed Aug. 29, 2003 now U.S. Pat. No. 6,784,069, entitled "PERMEABLE CAPACITOR ELECTRODE" which is hereby incorporated in its entirety herein.

BACKGROUND OF THE INVENTION

1. Field of the Invention

The present invention relates to electronic devices and, in particular, relates to devices and methods of forming capacitors for integrated circuitry.

2. Description of the Related Art

Since the introduction of the digital computer, electronic storage devices have been a vital resource for the retention of binary data. Conventional semiconductor electronic storage devices typically incorporate capacitor and transistor type structures, which are referred to as Dynamic Random Access Memory (DRAM), that temporarily store binary data based on the charged state of the capacitor structure. In general, this type of semiconductor Random Access Memory (RAM) often requires densely packed capacitor structures that are easily accessible for electrical interconnection therewith. Many of these capacitor structures are fabricated with layers of material including semiconductor, dielectric, and metal.

Some conventional capacitor structures have lower electrodes that are fabricated by first forming sacrificial spacers within a recessed substrate such that the capacitor occupies less than the width of the recess formed in the substrate. Conventional fabrication techniques of the lower electrode are complex and often requires many process steps. Typical process steps often require etching of a recess in a substrate, contiguous deposition of a sacrificial material layer on the substrate and within the recess, and etching of the sacrificial material layer so as to form sacrificial spacers on the sidewalls of the recess. Unfortunately, these sacrificial spacers reduce the width of the recess, which also reduces the effective width of the capacitor structure. Further processing steps require contiguous deposition of conductive material on the substrate and within the recess so as to overlie the sacrificial spacers, planar etching of the conductive layer to the substrate surface so as to form the lower electrode, and etching away of the sacrificial spacers so as to form cavities between the lower electrode and the substrate. Then, to form the rest of the capacitor structure, the dielectric layer followed by the top conductive layer can be deposited on the lower electrode.

Due to the excessive process steps involved with the use and formation of sacrificial spacers, inefficiencies can arise through the use of sacrificial spacers, which can inadvertently increase fabrication costs due the excessive process times, procedures, and materials. Another problem with using sacrificial spacers is that the capacitor structure including the lower electrode cannot use the full width of the recess, which can adversely affect the performance of the capacitor structure. Hence, there currently exists a need to reduce manufacturing costs associated with fabricating capacitor structures by simplifying inefficient procedures. To this end, there also exists a need to increase fabrication efficiency by improving the processing techniques associated with fabricating capacitor structures.

SUMMARY OF THE INVENTION

The aforementioned needs may be satisfied by a method of forming a capacitor structure on a substrate of the present teachings. In one embodiment, the method may comprise forming a recess in the substrate, positioning a first conductive layer on the substrate so as to overlie the substrate and the recess, and contouring the first conductive layer so as to define a lower electrode within the recess. In addition, the method may further comprise exposing the substrate and the lower electrode to an etchant, wherein the etchant diffuses through the lower electrode and etches the substrate away from the lower electrode to thereby at least partially isolate the lower electrode. Moreover, the method may still further comprise depositing a dielectric layer on the isolated lower electrode and depositing a second conductive layer on the dielectric layer so as to form an upper electrode.

In one aspect, the method may still further comprise depositing an insulation layer on the second conductive layer. In addition, forming a recess in the substrate may include etching a recess in the substrate so as to define a cell container having a recessed interior field region. Also, positioning a first conductive layer may include depositing a thin layer of conductive material, wherein depositing a thin layer of conductive material may include depositing a conductive layer to at least greater than approximately 150 A. Moreover, positioning a first conductive layer may include depositing a permeable layer of conductive material. Also, positioning a first conductive layer may include depositing a first conductive material selected from the group consisting of a metal, metal alloy, and a semiconductor including polysilicon, TiN, and WSi. In another aspect, contouring the first conductive layer may include planar etching the first conductive layer down to the substrate. In addition, exposing the substrate and the lower electrode to an etchant may include exposing the substrate and the lower electrode to HF. Also, depositing a dielectric layer may include depositing a dielectric material selected from the group consisting of Aluminum-Oxide ($Al_2O_3$) and Hafnium-Oxide ($HfO_3$). Moreover, depositing the second conductive layer may include depositing a second conductive material selected from the group consisting of a metal, metal alloy, and a semiconductor including polysilicon, TiN, and WSi.

The aforementioned needs may also be satisfied by a method of forming a plurality of capacitor structures on a substrate. In one embodiment, the method may comprise forming a plurality of recesses in the substrate, depositing a first conductive layer on the substrate so as to overlie the plurality of recesses, and defining a plurality of lower electrodes within the recesses formed in the substrate by removing at least a portion of the first conductive layer. In addition, the method may further comprise treating the substrate through the lower electrodes to thereby remove at least a portion of the substrate to thereby at least partially isolate the lower electrodes, depositing a dielectric layer on the isolated lower electrodes, and depositing a second conductive layer on the dielectric layer so as to form an upper electrode.

The aforementioned needs may also be satisfied by a method of forming a plurality of capacitor structures on a substrate. In one embodiment, the method may comprise forming a plurality of recesses in the substrate a first distance apart so as to define a common region therebetween, depositing a first conformal layer of conductive material on the substrate so as to overlie the substrate and the recess, and removing at least a portion of the first conformal layer so as to define a plurality of lower electrodes within the recesses.

In addition, the method may further comprise exposing the substrate and lower electrodes to an etchant selected to remove at least a portion of the substrate surrounding the lower electrodes including the common region between the lower electrodes to thereby at least partially isolate the lower electrodes. Moreover, the method may still further comprise depositing a conformal dielectric layer on the isolated lower electrode and depositing a second conformal layer of conductive material on the dielectric layer so as to form an upper electrode.

The aforementioned needs may also be satisfied by a capacitor device formed on a substrate. In one embodiment, the device may comprise a lower electrode having permeable sidewalls that allow an etchant to diffuse therethrough so as to etch back at least a portion of the substrate therefrom, a dielectric layer formed on the lower electrode, and an upper electrode formed on the dielectric layer. In one aspect, the lower electrode may comprise a semiconductor material, the dielectric layer may comprise an insulation material, and the upper electrode may comprise a metal material to thereby form an MIS capacitor device. In another aspect, the lower electrode may comprise a metal material, the dielectric layer may comprise an insulation material, and the upper electrode may comprise a metal material to thereby form an MIM capacitor device. In still another aspect, the lower electrode may comprise a semiconductor material, the dielectric layer may comprise an insulation material, and the upper electrode may comprise a semiconductor material to thereby form an SIS capacitor device. These and other objects and advantages of the present teachings will become more fully apparent from the following description taken in conjunction with the accompanying drawings.

DETAILED DESCRIPTION OF THE PREFERRED EMBODIMENT

Reference will now be made to the drawings wherein like numerals refer to like parts throughout. An improved device and method for forming capacitor structures will be described in greater detail herein below with reference to the drawings.

Figure 1A:
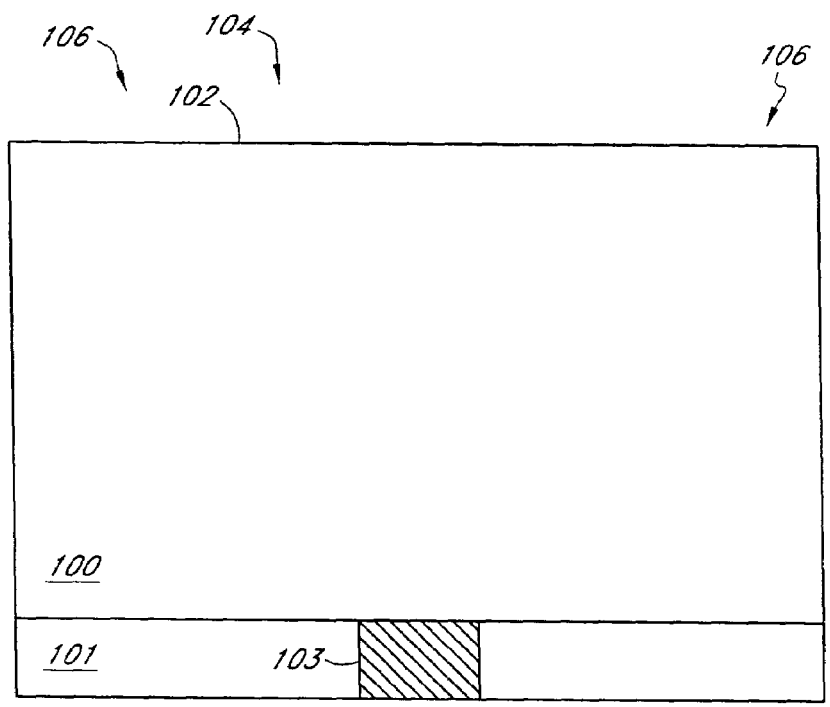
FIGS. 1A–1I illustrate one embodiment of a method for forming a capacitor structure.

FIGS. 1A–1I illustrate one embodiment of a method for forming at least one capacitor structure. In particular, FIG. 1A illustrates one embodiment of a first interlayer dielectric (ILD) layer 100 deposited on a second ILD layer 101. As illustrated, the first ILD layer 100 may comprise an upper surface 102 and an interior field region 104 surrounded by a periphery field region 106. In one embodiment, the ILD layers 100, 101 may comprise an insulative material, such as borophosphosilicate glass (BPSG), or other generally known materials, such as phosphosilicate glass (PSG), Tetra Ethyle Ortho Silicate (TEOS), silicon, glass, polymer, etc. In addition, the second ILD layer 101 may comprise a generally known conductive plug, trace, or contact 103 that abuts the first ILD layer 100. It should be appreciated that the plug, trace, or contact 103 defines a capacitor node region 105 and may comprise a generally known electrical interconnect between the first ILD layer 100 and a circuit component (not shown), such as a transistor or various other types of circuit components. Moreover, It should also be appreciated that the periphery field region may include any region on the first ILD layer 100.

In one aspect, either of the illustrated ILD layers 100, 101 may be referred to as a "substrate" and may also comprise at least a portion of a conventional silicon wafer, but can more generally encompass structures comprising semiconductive material or variations thereof, including, but not limited to, bulk semiconductor materials such as a semiconductor wafer (either alone or in assemblies comprising other materials thereon), and semiconductive material layers (either alone or in assemblies comprising other materials). Moreover, the term "ILD" or "substrate" may also encompass any supporting or layered structures, including, but not limited to, oxide or semiconductive structures, layers, or substrates. Furthermore, when reference is made to the ILD layers 100, 101 within the following description, previous processing steps may have been utilized to form regions, structures, or junctions in or on its base oxide or semiconductor structure or foundation.

Figure 1B:
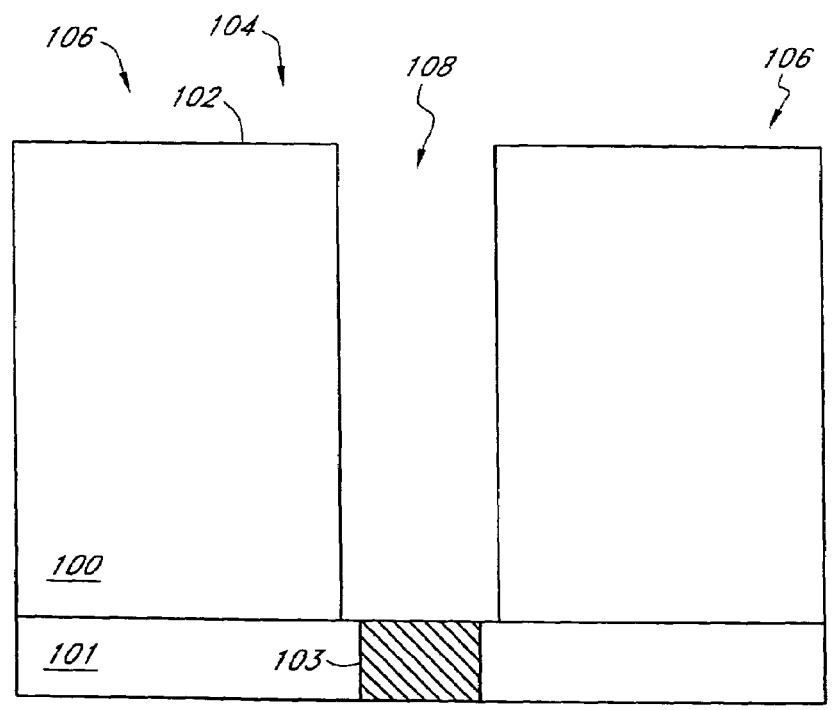

FIG. 1B illustrates the formation of a recess or cell container 108 in the interior field region 104 of the first ILD layer 100. It should be appreciated that the cell container 108 may be formed in the interior or periphery filed region 104, 106 of the first ILD layer 100 without departing from the scope of the present teachings. Formation of the cell container 108 may comprise a generally known photo-mask pattern and etch technique that is adapted to etch the first ILD layer 100 below the upper surface 102 to a depth, for example, of approximately 2 microns so as to define the shape or contour of cell container 108. Also, as illustrated, the cell container 108 may be etched to the plug 103 of the second ILD layer 101. It should be appreciated that the depth of the cell container 108 may vary in magnitude depending on the particular application without departing from the scope of the present teachings. Additionally, in one embodiment, as illustrated in FIG. 1B, the contour of the cell container 108 may resemble a substantially rectangular shape. It should be appreciated that the contour of the cell container 108 may comprise various other shapes, such as circular, elliptical, cylindrical, triangular, etc., without departing from the scope of the present teachings.

Figure 1C:
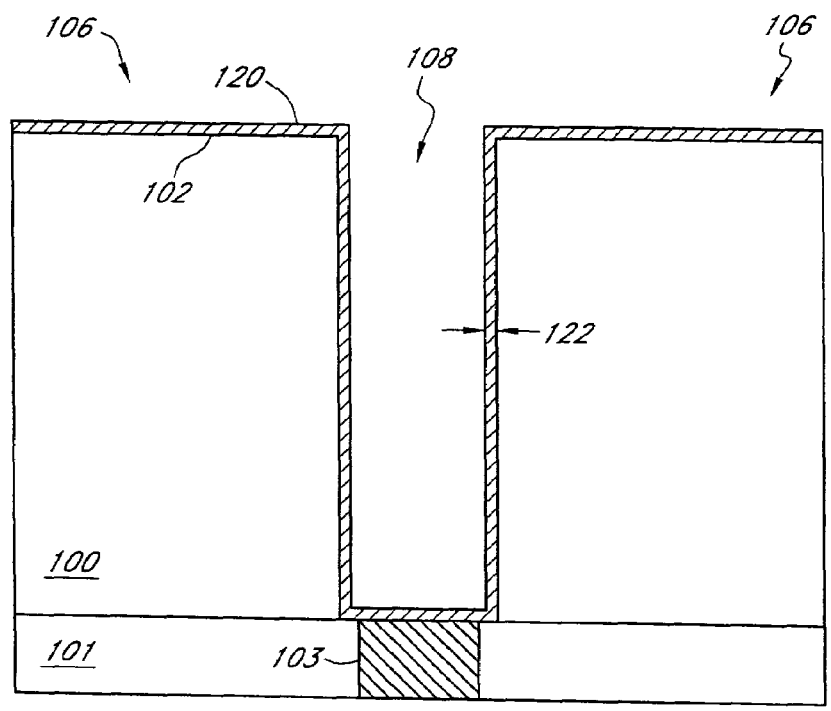

FIG. 1C illustrates the conformal deposition of a first conductive layer 120 on the upper surface 102 of the first ILD layer 100 and within the cell container 108. In one embodiment, the first conductive layer 120 may be deposited using, for example, a generally known furnace deposition process, such as chemical vapor deposition (CVD), plasma enhanced CVD (PECVD), or the like. In addition, the first conductive layer 120 may comprise a thin layer of conductive material, such as doped polysilicon, having a thickness 122, for example, of approximately 225 A. In one aspect, the first conductive layer 120 may be deposited within the cell container 108 so as to overlie the width of the cell container 108. Moreover, the first conductive layer 120 may be deposited adjacent the plug 103 so as to be in electrical contact therewith.

It should be appreciated that the first conductive layer 120 may be deposited using any one of a number of generally known deposition techniques without departing from the scope of the present teachings. In addition, it should be appreciated that various other conductive materials, such as TiN, WSi, and metal or metal alloys including at least a portion of copper, aluminum, silver, gold, platinum, rhodium, etc., may be deposited without departing from the scope of the present teachings. Moreover, it should also be appreciated that the thickness 122 of the first conductive layer 120 may vary in magnitude, for example, of at least greater than 150 A in the case of silicon (Si) or, in other cases, thinner with various types of metals or metal alloys. Therefore, in one embodiment, the thickness 122 of the first conductive layer 120 may vary between approximately 50 A and 350 A depending on the particular application or implementation without departing from the scope of the present teachings. However, it should also be appreciated by one skilled in the art that the thickness 122 of the first conductive layer 120 may be greater than 350 A depending on the desired results, application, or implementation without departing from the scope of the present teachings.

In one embodiment, the first conductive layer 120 is thinly deposited so as to comprise permeable or porous characteristics. As will be described in greater detail herein below, the first conductive layer 120 will be adapted to define a lower electrode (FIG. 1D) of a capacitor structure (FIGS. 1H, 1I), wherein the permeability or porosity of the first conductive layer 120 may be selected to allow an etchant to diffuse through the lower electrode. Advantageously, the lower electrode of the capacitor structure is formed to be permeable or porous to an etchant so as to allow etching back of the first ILD layer 100 adjacent the lower electrode without the use of sacrificial spacer films. Further scope of the lower electrode and the capacitor structure will be described herein below.

Figure 1D:
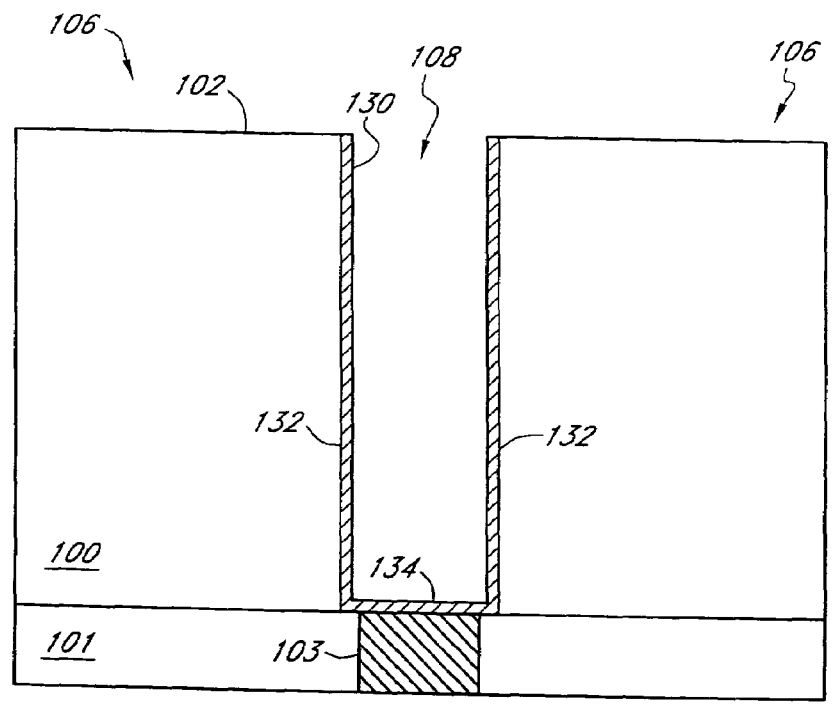

FIG. 1D illustrates the planarization of the first conductive layer 120 adjacent the upper surface 102 of the first ILD layer 100 so as to define a lower electrode or lower cell plate 130 within the cell container 108. In one embodiment, a generally known chemical mechanical planarization (CMP) process may be used to planar etch the first conductive layer 120, as illustrated in FIG. 1C, adjacent the upper surface 102 in a manner so as to isolate the lower electrode 130 as illustrated in FIG. 1D. As further illustrated in FIG. 1D, the width of the lower electrode 130 comprises the width of the cell container 108. Also, the lower electrode 130 may comprise sidewalls 132 and a base wall 134 that are joined together so as to define the lower electrode 130, which may also be referred to as an isolated post container. Advantageously, the sidewalls 132 of the lower electrode 130 are deposited or formed thin enough to comprise permeable or porous characteristics, wherein the scope of the permeable sidewalls 132 will be described in greater detail herein below. Moreover, the base wall 134 of the lower electrode 130 is in electrical contact with the plug 103.

In one embodiment, the lower electrode 130 can be made permeable or porous by introducing some impurity into the material of the lower electrode 130 and then selectively removing or etching the impurity from the lower electrode 130. In one example, the lower electrode 130 may be formed of polysilicon, which can be deposited in a manner as previously described and followed by a rapid thermal oxidation (RTO) treatment. Once the polysilicon based lower electrode 130 is at least partially oxidized, the oxide can be selectively etched from the lower electrode 130 to thereby form a permeable or porous lower electrode 130. In another example, the lower electrode may be formed of titanium-nitride (TiN), which can be deposited in a manner as previously described and followed by a impurity doping treatment. Once the TiN based lower electrode 130 is doped, the dopant can be selectively etched from the lower electrode 130 to thereby form a permeable or porous lower electrode 130. It should be appreciated that the degree of permeability or porosity may be selected to allow an etchant to diffuse through the sidewalls 132 of the lower electrode 130 in a manner as will be described in greater detail herein below. Moreover, it should be appreciated that various other types of treatments may be used to form a permeable or porous lower electrode 130 without departing from the scope of the present teachings.

Figure 1E:
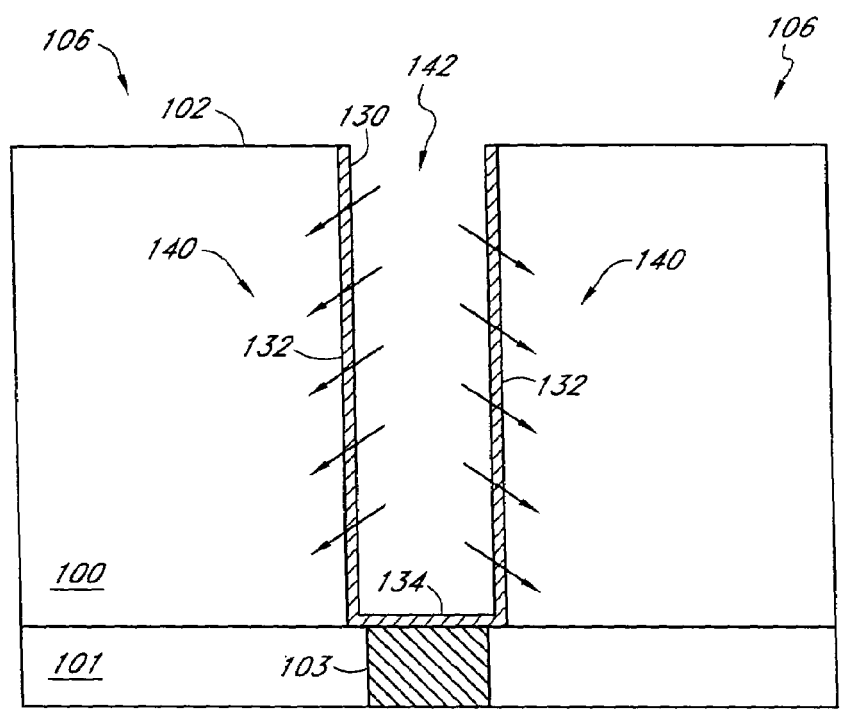

FIG. 1E illustrates etching of an interior portion 140 of the first ILD layer 100 in contact with the sidewalls 132 of the lower electrode 130. In one embodiment, an etching process, such as a wet etch of Si for example, may be used for approximately 90 seconds, wherein the timing of the etching process may vary depending on the material being etched and the desired results of the skilled artisan. In addition, the wet etch may comprise the use of an etchant 144, for example, such as HF (hydrogen-fluoride), having a pre-defined concentration, which diffuses through the permeable sidewalls 132 of the lower electrode 130 and etches the one or more interior portions 140 of the first ILD layer 100 in contact therewith. Advantageously, the sidewalls 132 of the lower electrode 130 are thin enough to be permeable to thereby allow the etchant 142 to diffuse therethrough and etch away at least a portion of the first ILD layer material adjacent to the sidewalls 132 of the lower electrode 130. In addition, the etchant 142 may be desirably selected to allow etching of the first ILD layer material without etching the lower electrode 130.

Figure 1F:
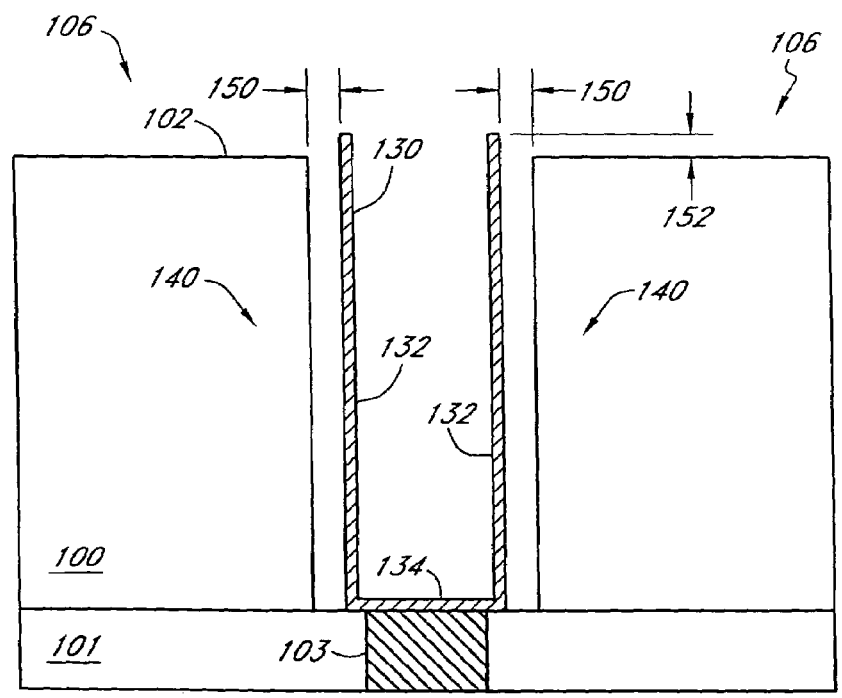

FIG. 1F illustrates the resultant free-standing structure of the lower electrode 130 after etching of the first ILD layer 100 as described with reference to FIG. 1E. In one embodiment, as illustrated in FIG. 1F, the interior portion 140 of the first ILD layer 100 that was in contact with the sidewalls 132 of the lower electrode 130 may be etched back a first distance 150 of at least 400 A. It should be appreciated by one skilled in the art that etch back distance may vary in magnitude depending on the capacitor stack and shrink including various other associated processing factors, and, therefore, the scope of the present teachings as described herein should not be limited by the disclosed example. In addition, the sidewalls 132 of the lower electrode 130 are thick enough to stand erect after etch back of the interior portion 140 of the first ILD layer 100. Moreover, during etching, the upper surface 102 including at least a portion of the periphery field region 106 may be etched down a second distance 152 of approximately 400 A.

In one aspect, the first ILD layer 100 may be over-etched by an amount greater than the 400 A depending on the particular application or desired results. For example, the etch distances 150, 152 may comprise 400 A plus 20–50% (preferably 50% or more preferably approximately 20%). In another example, the etch distances 150, 152 may comprise a distance of approximately 400 A to approximately 1200 A or at least less than 1500 A. In one aspect, an over-etch window may be defined by the distance between capacitor structures and some percent over-etch, wherein less over-etch is more desirable. It should be appreciated that the first and second distances 150, 152 of the first ILD layer etch back may vary in magnitude depending on the length of time that the etchant 142 is exposed to the first ILD layer material during the etching process. In addition, it should also be appreciated that the first and second distances 150, 152 may vary in magnitude depending on the desired results of the skilled artisan without departing from the scope of the present teachings.

Figure 1G:
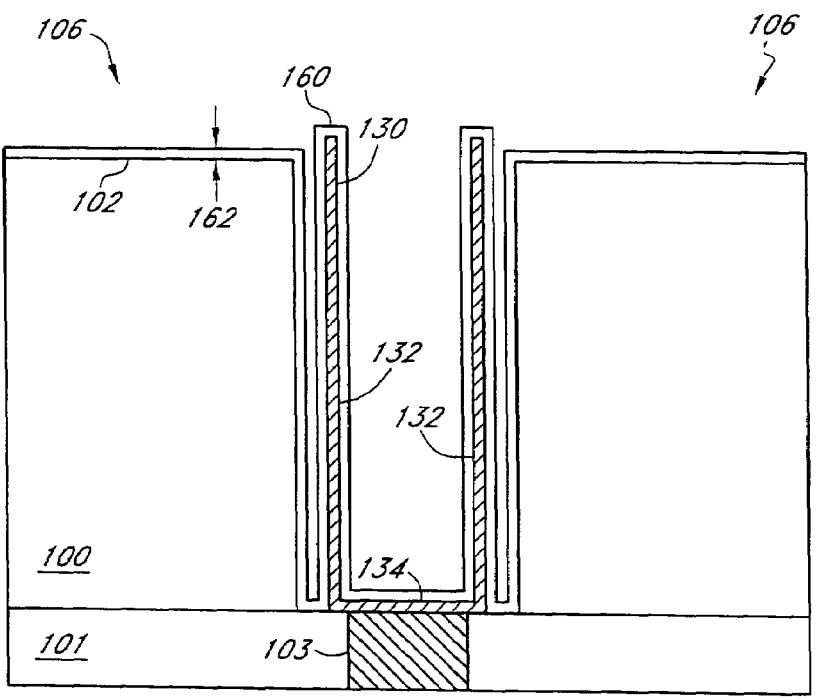

FIG. 1G illustrates the conformal deposition of a dielectric layer 160 on the upper surface 102 and the lower electrode 130 including the sidewalls 130 and the base wall 134. In one embodiment, the dielectric layer 160 may comprise a layer of insulative material, such as Aluminum-Oxide ($Al_2O_3$) or Hafnium-Oxide ($HfO_3$) having a thickness 162, for example, of approximately 20–200 A. Various fabrication techniques may be utilized for forming the dielectric layer 160 including, for example, deposition of an aluminum layer in a manner well known in the art followed by oxidizing the deposited aluminum layer by one of several different methods: plasma oxidation, oxidation by air, and ion-beam oxidation, wherein all are derived in a manner well known in the art. It should be appreciated that various other insulative materials may be deposited without departing from the scope of the present teachings. It should also be appreciated that the thickness 162 of the dielectric layer 160 may vary in magnitude, for example, between approximately 20 A and 200 A, depending on the particular implementation without departing from the scope of the present teachings.

Additionally, in one embodiment, as illustrated in FIG. 1G, the upper surface 102 may be masked in a generally known manner so that a portion of the upper surface 102 adjacent the lower electrode 130 is covered by the dielectric layer 160. In addition, the dielectric layer 160 may be deposited in a manner so as to overlie the contour of the lower electrode 130 including overlying the interior and exterior of the sidewalls 132 and the base wall 134. Also, the dielectric layer 160 may be deposited in a manner so as to overlie the contour of the interior portions 140 of the first ILD layer 100 that was etched back from the sidewalls 132 of the lower electrodes 130. It should be appreciated that the dielectric layer 160 may also be deposited on at least a portion of the upper surface 102 of the first ILD layer 100 without departing from the scope of the present teachings.

Figure 1H:
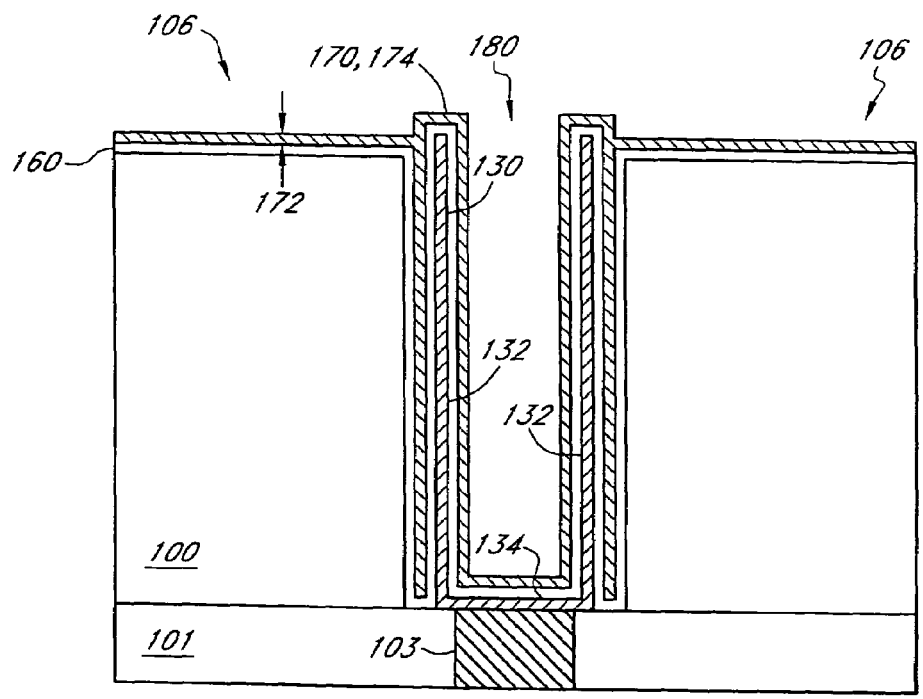

FIG. 1H illustrates the conformal deposition of a second conductive layer 170 on the dielectric layer 160. In one embodiment, the second conductive layer 170 may comprise a layer of conductive material, such as TiNi, WSi, metal, or metal alloy, having a thickness 172. It should be appreciated that the second conductive layer 170 may comprise multiple layers or stacks of varying thicknesses without departing from the present teachings. In addition, the second conductive layer 170 may comprise one or more layers or stacks of Si, doped Si, Ti, TiN, W, $WSi_x$, or any other semiconductor or metallic material. Moreover, it should be appreciated that any combination of thicknesses appropriate to the capacitor stack or structure and/or to fill the capacitors in an array may be used.

Also, the second conductive layer 170 may be formed using, for example, a generally known furnace deposition process, such as CVD, PECVD, or the like. It should be appreciated that various other conductive materials or at least a portion thereof, such as copper, aluminum, silver, gold, platinum, rhodium, etc., may be deposited without departing from the scope of the present teachings. In addition, it should also be appreciated that the thickness 172 of the second conductive layer 170 may vary in magnitude depending on the particular implementation without departing from the scope of the present teachings. Also, it should be appreciated that the second conductive layer 170 may also be deposited on at least a portion of the upper surface 102 of the first ILD layer 100 without departing from the scope of the present teachings. Moreover, the second conductive layer 170 may be deposited in a manner so as to contour the shape lower electrode 130 and overlie the dielectric layer 160 that was deposited adjacent the sidewalls 132 and base wall 134 of the lower electrode 130.

In one embodiment, the second conductive layer 170 defines an upper electrode or top cell plate 174. In addition, the layering of the lower electrode 130, the dielectric layer 160, and the top cell plate 174 define a capacitor structure 180. The capacitor structure 180 may be used in memory devices, such as DRAM, or various other circuit devices, such as discrete capacitors and antifuses. As illustrated in FIG. 1H, the capacitor structures 180 are in electrical contact with the plugs 103, respectively.

Additionally, the capacitor structure 180, as illustrated, defines a metal-insulator-semiconductor (MIS) device that may be used as a MIS capacitor in integrated circuitry. It should be appreciated that the one or more of the device layers may be replaced with various other types of materials so as to form different types of capacitor devices for use in integrated circuitry. For example, the lower electrode 130 comprising, for example, polysilicon may be replaced with a metal or metal alloy to thereby define a metal-insulator-metal (MIM) device that may be used as a MIM capacitor. In another example, the metal and/or the semiconductor layers may be replaced with TiN (Titanium-Nitride) and/or WSi (Tungsten-Silicon) so as to form another type of capacitor device. In still another example, the one or more metal layers or electrodes may be replaced with semiconductor material so as to form still another type of capacitor device comprising, for example, a semiconductor-insulator-semiconductor (SIS) device including a silicon-insulator-silicon device. Therefore, it should be appreciated by one skilled in the art that the upper and lower electrode material, whether these layers comprise metal, material, metal alloy material, semiconductor material, or various other types of materials, may be deposited or formed in a manner so as to comprise permeable characteristics, including etchant permeable characteristics, to thereby allow etching of the first ILD layer material adjacent the lower electrode 130 therethrough in a manner as previously described.

Figure 1I:
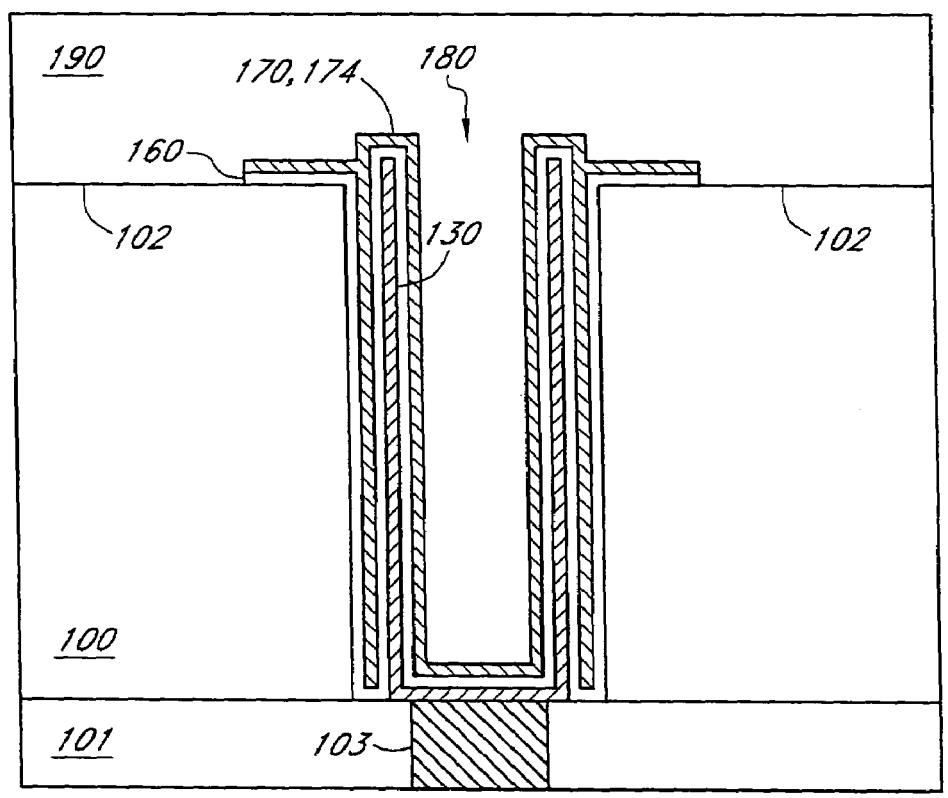

FIG. 1I illustrates the conformal deposition of an insulation layer or third ILD layer 190 on the upper surface 102 and the second conductive layer 170. In one embodiment, the insulation layer 190 may be deposited in a manner so as to contour the shape of the capacitor structure 180 and overlie the top electrode plate 174. In addition, the insulation layer 190 may comprise a similar material as the first ILD layer 100, such as BPSG or the various other substrate materials as previously described. It should be appreciated that, prior to depositing the insulation layer 190 on the second conductive layer 170, the dielectric layer 160 and the second conductive layer 170 may have been patterned in a generally known manner. As illustrated in FIG. 1I, a portion of the dielectric layer 160 and the second conductive layer 170 may be etched from the upper surface 102 of the first ILD layer 100 to isolate the capacitor structure 180 from neighboring components. Advantageously, the insulation layer 190 insulates the capacitor structure 180 from other circuit components either embedded or otherwise located adjacent thereto and provides a means for access to the upper electrode 174 of the capacitor structure 180. In one aspect, generally known vias (not shown) may be formed in the insulation layer 190 to the depth of the upper electrode or top cell plate 174 to thereby provide access thereto.

The advantage of fabricating a capacitor structure 180 in a manner as previously described herein, with reference to FIGS. 1A–1I, is that unnecessary processing steps and redundant fabrication procedures will be, in this embodiment, reduced from the overall manufacturing process. Beneficially, the present teachings reduce the need for separately etching back the field periphery region 106 and/or the formation and use of sacrificial spacer films or layers to form the lower electrode 130 of the capacitor structure 180.

In one aspect, the capacitor structure 180 of the present teachings has increased capacitance due to the increased surface area. Since sacrificial spacer layers are not used to form the lower electrode 130, for example, between the recess walls of the cell container 108 in the first ILD layer 100 and the sidewalls 132 of the lower electrode 130, the width of the capacitor structure 180 is larger than the prior art devices. In general, the larger the surface area of a capacitor structure, the larger the capacitance.

Moreover, standard processing may be used prior to lower electrode 130 deposition for the first conductive layer 120 of conductive material, such as doped polysilicon or TiN, to approximately greater than 150 A in thickness. In addition, after planar processing of the first conductive layer 120 using, for example, a CMP technique, a number of resist cleans with an etchant, such as HF, may be used to recess the field periphery region 106, as illustrated in FIG. 1F, to at least greater than 400 A. In one aspect, it should be appreciated that a dry or wet etching technique may be used to planarize the first conductive layer 120 without departing from the scope of the present teachings. Advantageously, in another aspect of the present teachings, the permeability of the >150 A lower electrode 130, comprising for example polysilicon or TiN, allowed the first ILD layer material, for example BPSG, to be removed around the lower electrode 130 of the capacitor structure 180, which resulted in the field periphery region 106 being removed with reduced surface topography. Beneficially, by eliminating unnecessary fabrication steps and procedures, an overall reduction in manufacturing costs is achieved. This embodiment of the present teachings prevails in production cost reduction and efficiency.

Figure 2A:
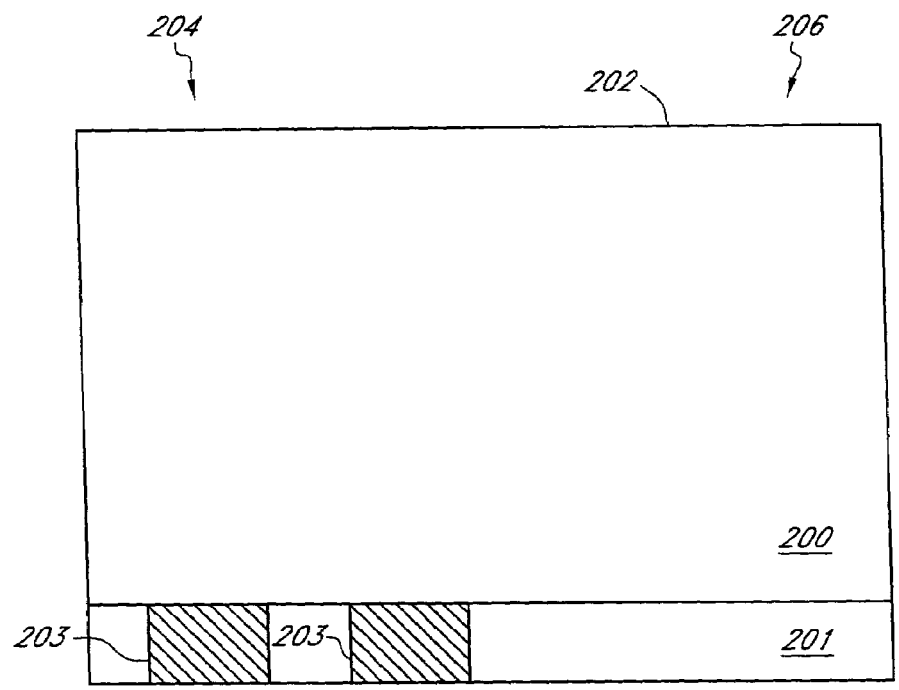
FIGS. 2A–2I illustrate another embodiment of a method for forming double-sided capacitor structures.

FIGS. 2A–2I illustrate one embodiment of a method for forming one or more double-sided capacitor structures. In particular, FIG. 2A illustrates one embodiment of a first ILD layer 200 deposited on a second ILD layer 201. As illustrated, the first ILD layer 200 may comprise an upper surface 202 and an interior field region 204 adjacent to a periphery field region 206. In one embodiment, the ILD layers 200, 201 may comprise an insulative material, such as BPSG, or other generally known materials, such as PSG, TEOS, silicon, glass, polymer, etc. In addition, the second ILD layer 201 may comprise a plurality of generally known conductive plugs, traces, or contacts 103 that define a plurality of capacitor node regions 205 and are separately formed so as to abut the first ILD layer 200.

It should be appreciated that the plugs, traces, or contacts 103 may comprise generally known electrical interconnects between the first ILD layer 100 and one or more circuit components (not shown), such as one or more transistors or various other types of circuit components known in the art. Moreover, it should be appreciated that the illustrated ILD layers 200, 201 may be similar in scope and function and may comprise similar features and attributes to the ILD layers 100, 101 as previously described with reference to FIGS. 1A–1I. Therefore, the previous discussions relating to ILD layers 100, 101 in FIGS. 1A–1I may be attributed to the ILD layers 200, 201 in FIGS. 2A–2I.

Figure 2B:
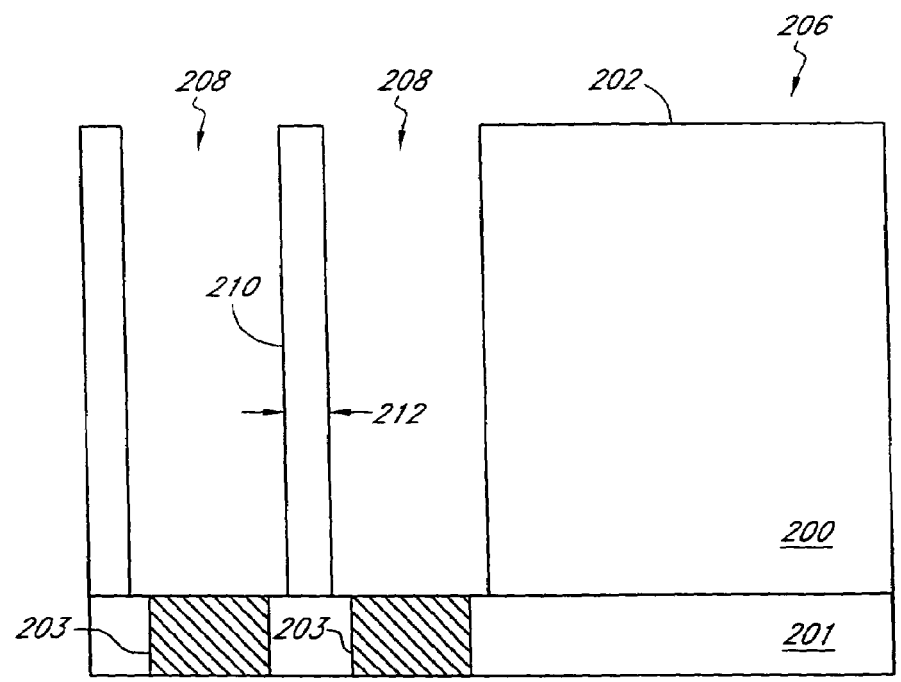

FIG. 2B illustrates the formation of a plurality of recesses or cell containers 208 in the interior field region 204 of the first ILD layer 200. It should be appreciated that the recesses or cell containers 208 may be formed in the interior or periphery field region 204, 206 of the first ILD layer 200 without departing from the scope of the present teachings. In addition, it should be appreciated that the formation of the cell containers 208 and the attributes associated with the cell containers 208 are similar in scope and function to the cell container 108 as previously described with reference to FIG. 1B.

In one embodiment, as illustrated in FIG. 2B, the cell containers 208 are formed so as to define a common region 210 in the first ILD layer 200 that is interposed between the cell containers 208. In addition, the common region 210 may comprise a width 212 of approximately 800 A or at least less than 1000 A, but may vary in magnitude depending on the desired spacing of the cell containers 208 without departing from the scope of the present teachings. As with the cell container 108 in FIG. 1B, the contour of the cell containers 208 may resemble a substantially rectangular shape or various other shapes as previously described without departing from the scope of the present teachings. It should be appreciated that any number of cell containers or structures may be formed adjacent the illustrated cell containers or structures without departing from the scope of the present teachings. Also, the two illustrated cell containers may be part of an array of cell containers of any magnitude that can be used to form an array of capacitor structures in a manner as described herein.

Figure 2C:
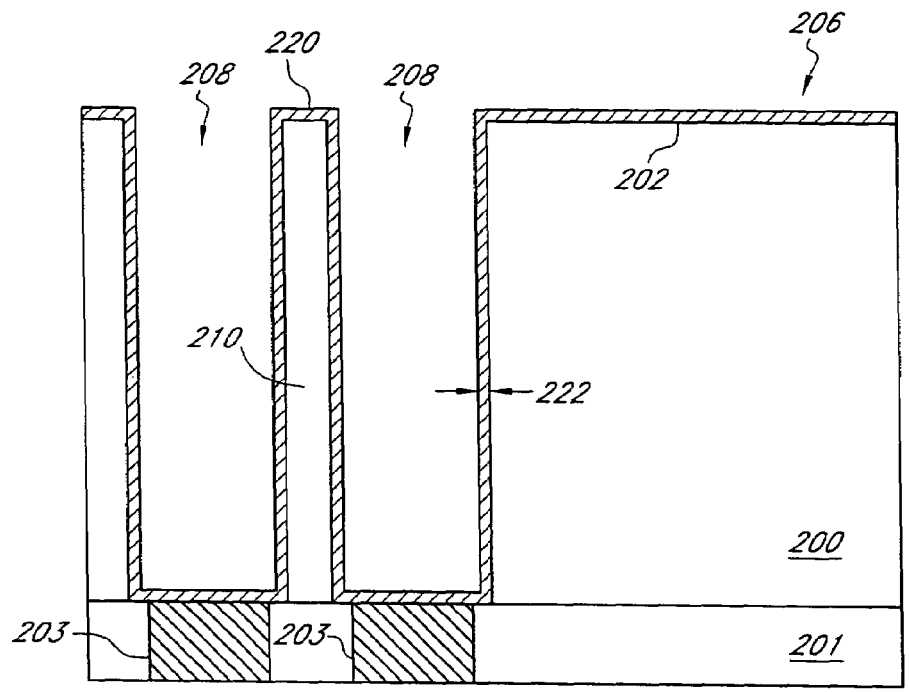

FIG. 2C illustrates the conformal deposition of a first conductive layer 220 on the upper surface 200 of the first ILD layer 200 and within the cell containers 208. In one embodiment, the first conductive layer 220 is deposited using, for example, a furnace deposition process, such as CVD, PECVD, or the like. In addition, the first conductive layer 220 may comprise a thin layer of conductive material, such as doped polysilicon, having a thickness 222, for example, of approximately 225 A. In one aspect, the first conductive layer 220 may be deposited within the cell containers 108 so as to overlie the width of the cell containers 208, respectively. Moreover, the first conductive layer 220 may be deposited adjacent the plugs 203 so as to be in electrical contact therewith.

It should be appreciated that the first conductive layer 120 may be deposited using any one of a number of generally known deposition techniques without departing from the scope of the present teachings. In addition, it should be appreciated that various other conductive materials, such as TiN, WSi, and metal or metal alloys including at least a portion of copper, aluminum, silver, gold, platinum, rhodium, etc., may be deposited without departing from the scope of the present teachings. Moreover, it should also be appreciated that the thickness 222 of the first conductive layer 220 may vary in magnitude, for example, of at least 150 A, between approximately 50 A and 350 A, or even up to approximately 1500 A, depending on the particular implementation without departing from the scope of the present teachings.

In one embodiment, the first conductive layer 220 is thinly deposited so as to comprise permeable or porous characteristics. The first conductive layer 220 may be adapted to define a plurality of lower electrodes (FIG. 2D) of a plurality of capacitor structures (FIGS. 2H, 2I), as will be described in greater detail herein below. Advantageously, the lower electrodes of the capacitor structures are permeable so as to allow etching of the first ILD layer 200 adjacent the lower electrode including the common region 210 without excessive etching back of the field periphery region 206 or the use of sacrificial spacer layers or films. Further scope and function of the lower electrodes and the capacitor structures will be described in greater detail herein below.

Figure 2D:
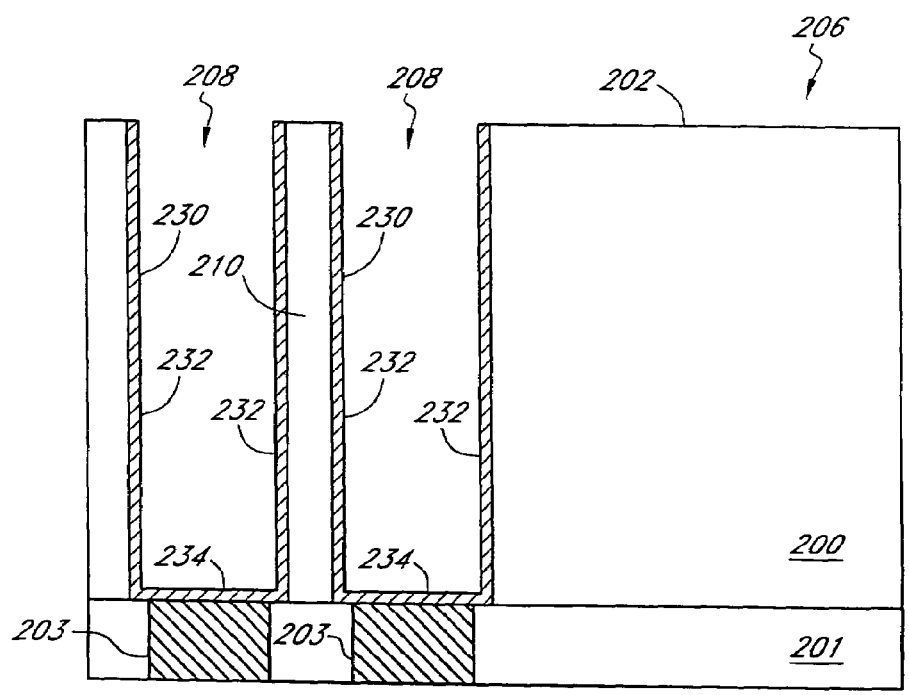

FIG. 2D illustrates the planarization of the first conductive layer 220 adjacent the upper surface 200 of the first ILD layer 200 so as to define a plurality of lower electrodes or lower cell plates 230 within the cell containers 208. In one embodiment, a generally known CMP process may be used to planar etch the first conductive layer 220, as illustrated in FIG. 2C, adjacent the upper surface 200 in a manner so as to isolate the lower electrodes 230 as illustrated in FIG. 2D. In one aspect, it should be appreciated that a dry or wet etching technique may be used to planarize the first conductive layer 220 without departing from the scope of the present teachings.

Additionally, as further illustrated in FIG. 2D, the lower electrodes 230 may each comprise sidewalls 232 and a base wall 234 that are joined together so as to define the lower electrodes 230, respectively, which may also be referred to as isolated post containers. Advantageously, the sidewalls 232 of the lower electrodes 230 are deposited or formed thin enough to comprise permeable or porous characteristics, wherein the scope and function of the permeable sidewalls 232 will be described in greater detail herein below. In one embodiment, the lower electrodes 230 can be made permeable or porous in a similar manner as previously described with reference to the FIG. 1D. Moreover, the base walls 134 of the lower electrodes 130 are in electrical contact with the plugs 103, respectively.

Figure 2E:
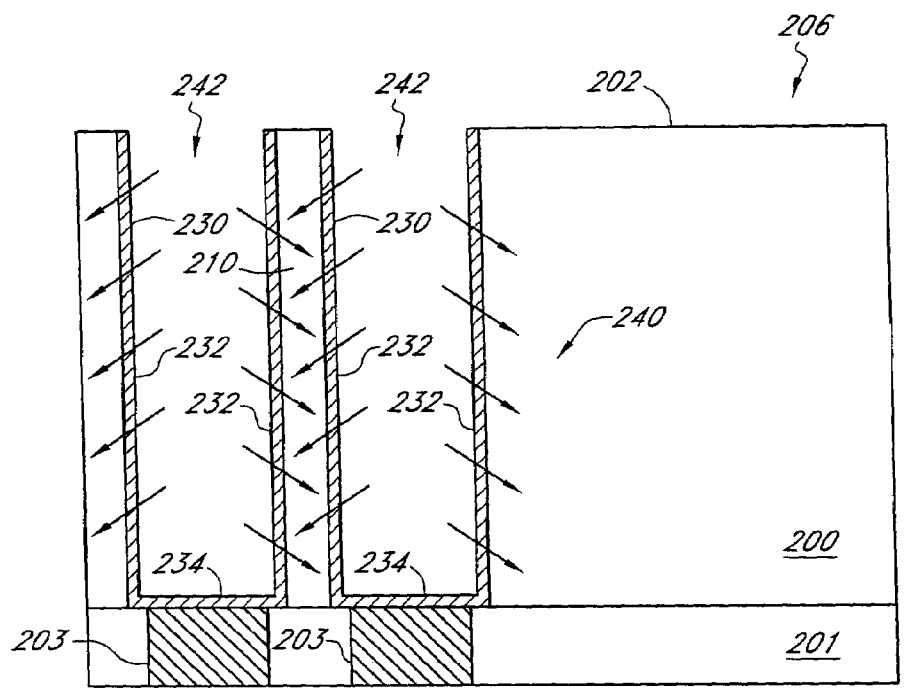

FIG. 2E illustrates etching of the common region 210 and the one or more interior portions 240 of the first ILD layer 200 in contact with the sidewalls 232 of the lower electrodes 230. In one embodiment, an etching process, such as a wet etch of Si for example, may be used for approximately 90 seconds, wherein the timing of the etching process may vary depending on the material being etched and the desired results of the skilled artisan. In addition, the wet etch may comprise the use of an etchant 244, such as HF for example, having a desired concentration, which diffuses through the permeable sidewalls 232 of the lower electrodes 230 and etches the common region 210 and interior portions 240 of the first ILD layer 200 in contact therewith. Advantageously, the sidewalls 232 of the lower electrodes 230 are thin enough to be permeable to thereby allow the etchant 242 to diffuse therethrough and etch away the common region 210 and at least a portion of the first ILD layer material adjacent to the sidewalls 232 of the lower electrodes 230. In addition, the etchant 242 may be desirably selected so as to allow etching of the first ILD layer material without etching the lower electrodes 230.

Figure 2F:
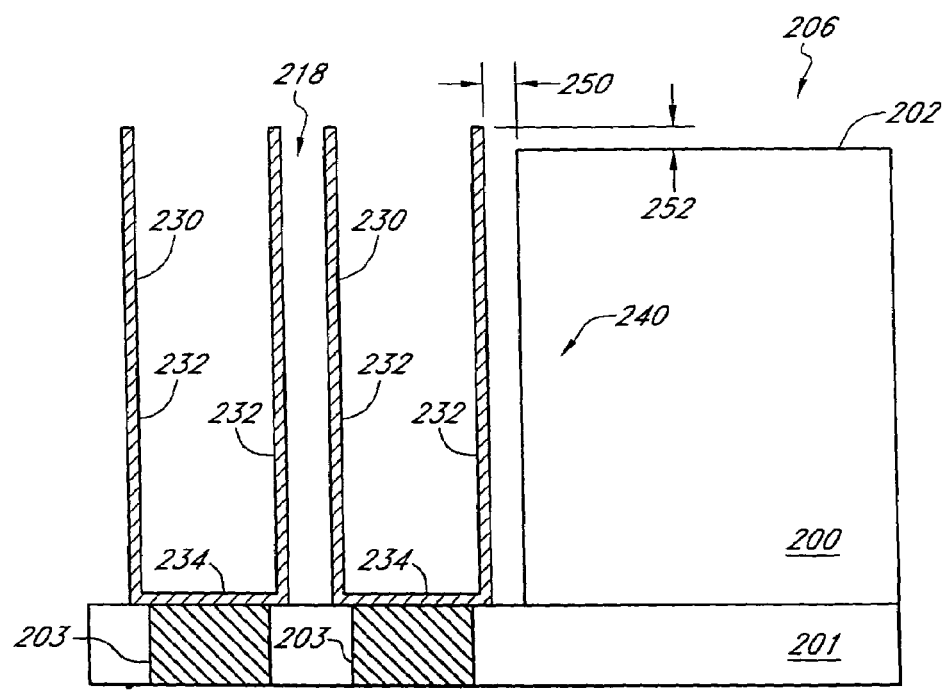

FIG. 2F illustrates the resultant free-standing structures of the lower electrodes 230 after etching of the first ILD layer 200 as described with reference to FIG. 2E. In one aspect, as illustrated in FIG. 2F, the one or more interior portions 240 of the first ILD layer 200 that were in contact with the sidewalls 232 of the lower electrode 230 may be etched back a first distance 250 of at least 400 A or at least less than 1200 A. In one aspect, it should be appreciated that the etch back distance may vary depending on the distance between the lower electrodes 230. It should also be appreciated that further scope and discussion relating to the etch back including over-etching is previously described in greater detail herein above with reference to FIG. 1F.

Additionally, in one embodiment, the sidewalls 232 of the lower electrodes 230 are thick enough to stand erect after etch back of the interior portion 240 of the first ILD layer 200. Moreover, as illustrated in FIG. 2F, the common region 210 may be etched away so as to define a cavity region 218 interposed between the lower electrodes 230. In one aspect, during etching, the upper surface 200 including at least a portion of the periphery field region 206 may be etched down a second distance 252 by an amount as previously described with reference to FIG. 1F. For example, the periphery field region 206 may be etched down approximately 400 A to approximately 1200 A or at least less than 1500 A. As a result of etching the first ILD layer material through the sidewalls 232 of the lower electrodes 230, the resultant structure of free-standing lower electrodes 230 may be referred to as double-sided containers that will be used to form double-sided capacitor structures, which will be described in greater detail herein below.

It should be appreciated that the first and second distances 250, 252 of the first ILD layer etch back may vary in magnitude depending on the length of time that the etchant 242 is exposed to the first ILD layer material during the etching process. Thus, the first and second distances 250, 252 may vary in magnitude depending on the desired results of the skilled artisan without departing from the scope of the present teachings.

Figure 2G:
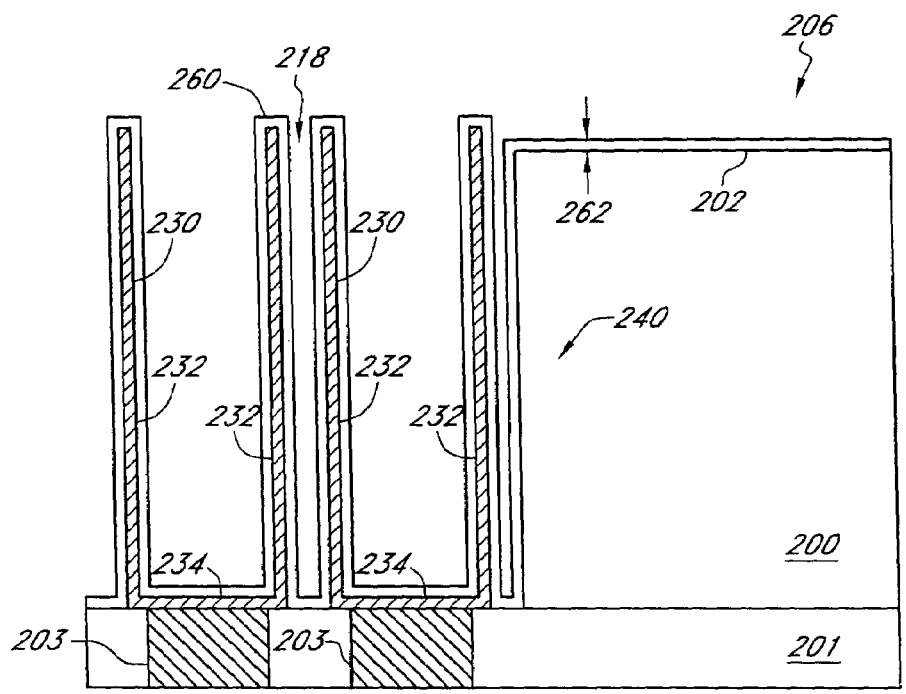

FIG. 2G illustrates the conformal deposition of a dielectric layer 260 on the upper surface 200 and the lower electrodes 230 including the sidewalls 230 and the base walls 234 thereof. In addition, as illustrated, the dielectric layer 260 may also be deposited in the cavity region 218 between the lower electrodes 230. Also, as illustrated in FIG. 2G, the dielectric layer 260 may be deposited in the one or more interior regions 240 of the first ILD layer 200 that were etched away from the sidewalls 232 of the lower electrodes 230. In one aspect, as further illustrated in FIG. 2G, the upper surface 200 of the first dielectric layer 200 may also be conformally covered by the dielectric layer 260. Moreover, the dielectric layer 260 may be deposited in a manner so as to overlie the contour of the lower electrodes 230 including overlying the sidewalls 232 and the base walls 234 of the lower electrodes 230 and including the interior portions 240 of the first ILD layer 200 that was etched back from the sidewalls 232 of the lower electrodes 230.

Furthermore, in one embodiment, the dielectric layer 260 may comprise a layer of insulative material, such as Aluminum-Oxide ($Al_2O_3$) or Hafnium-Oxide ($HfO_3$) having a thickness 262, for example, of approximately 10–300 A. It should be appreciated that the dielectric layer 260 may comprise multiple nano-laminates of varying thicknesses with an appropriate thickness range between approximately 10 A to 300 A. In addition, it should be appreciated that various other insulative materials may be deposited to form the dielectric layer 260 without departing from the scope of the present teachings. Additionally, it should also be appreciated that the thickness 262 of the dielectric layer 260 may vary in magnitude, for example, between approximately 10 A and 300 A, depending on the particular implementation without departing from the scope of the present teachings.

Figure 2H:
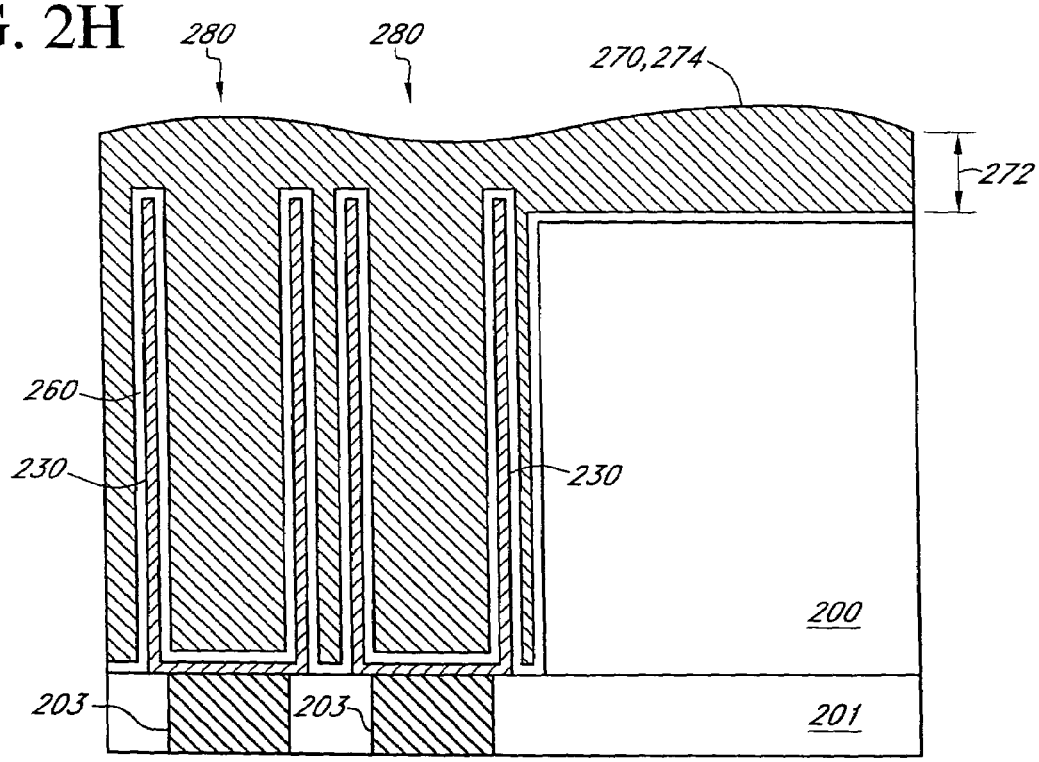

FIG. 2H illustrates the conformal deposition of a second conductive layer 270 on the dielectric layer 260. In addition, as illustrated in FIG. 2H, the second conductive layer 270 may also be deposited in the cavity region 218 between the lower electrodes 230. Also, as illustrated in FIG. 2H, the second conductive layer 270 may be deposited in the one or more interior regions 240 of the first ILD layer 200 that were etched away from the sidewalls 232 of the lower electrodes 230. It should be appreciated that the second conductive layer 270 may also be deposited on at least a portion of the upper surface 200 of the first ILD layer 200 without departing from the scope of the present teachings. In one embodiment, as further illustrated in FIG. 2H, the second conductive layer 270 may be deposited in a manner so as to contour the shape lower electrodes 230 and overlie the dielectric layer 260 that was deposited adjacent the sidewalls 232 and base walls 234 of the lower electrodes 230.

In one aspect, the second conductive layer 270 comprises a layer of conductive material, such as TiNi, WSi, metal, or metal alloy having a thickness 272. It should be appreciated that the second conductive layer 270 may comprise multiple layers or stacks of varying thicknesses without departing from the present teachings. In addition, the second conductive layer 270 may comprise one or more layers or stacks of Si, doped Si, Ti, TiN, W, WSi$_x$, or any other semiconductor or metallic material. Also, it should be appreciated that any combination of thicknesses appropriate to the capacitor stack or structure and/or to fill the capacitors in an array may be used. In one embodiment, the thickness 272 of the second conductive layer 270 may depend on the physical gap between structures or aspects thereof to determine the physical thickness of the deposited film. It should be appreciated that various other conductive materials or at least a portion thereof, such as copper, aluminum, silver, gold, platinum, rhodium, etc., may be deposited without departing from the scope of the present teachings. Moreover, it should also be appreciated that the thickness 272 of the second conductive layer 272 may vary in magnitude depending on the particular implementation without departing from the scope of the present teachings.

In one embodiment, the second conductive layer 270 defines an upper electrode or top cell plate 274. In addition, the layering of the lower electrodes 230, the dielectric layer 260, and the top cell plate 274 define a plurality of capacitor structures 280 having double-sided characteristics. Thus, these capacitor structures 280 may also be referred to as double-sided capacitor structures. Moreover, the double-sided capacitor structures 280 may be used in memory devices, such as DRAM, or various other circuit devices. As illustrated in FIG. 2H, the capacitor structures 280 are in electrical contact with the plugs 203, respectively.

In one embodiment, the capacitor structures 280, as illustrated, define double-sided metal-insulator-semiconductor (MIS) devices that may be used as double-sided MIS capacitors in integrated circuitry. It should be appreciated that the one or more of the device layers may be replaced with various other types of materials so as to form different types of capacitor devices for use in integrated circuitry. For example, the lower electrodes 230 comprising, for example, polysilicon may be replaced with metal or metal alloys to thereby define double-sided metal-insulator-metal (MIM) devices that may be used as double-sided MIM capacitors. In another example, the metal and/or the semiconductor layers may be replaced with TiN and/or WSi so as to form other types of capacitor devices. In still another example, the one or more metal layers or electrodes may be replaced with semiconductor material so as to form still another type of capacitor device comprising, for example, a semiconductor-insulator-semiconductor (SIS) device including a silicon-insulator-silicon device. It should be appreciated that the lower electrode material, whether it comprises metal or metal alloy material, semiconductor material, or various other types of materials, may be deposited or formed in a manner so as to comprise permeable characteristics, including etchant permeable characteristics, to thereby allow etching of the first ILD layer material adjacent the lower electrodes 230 therethrough in a manner as previously described.

Figure 2I:
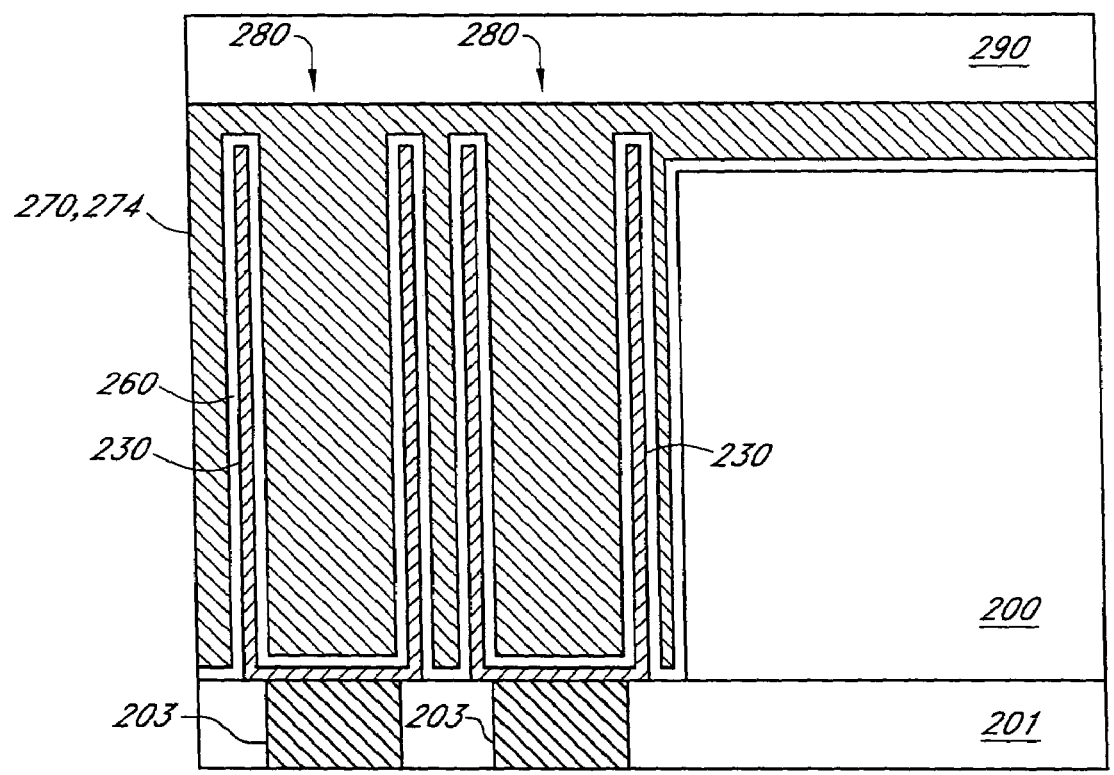

FIG. 2I illustrates the conformal deposition of an insulation layer 290 on the second conductive layer 270. As illustrated, the second conductive layer 270 may be planarized prior to deposition of the insulation layer 290 thereon using, for example, a CMP process. In one embodiment, the insulation layer 290 may be deposited in a manner so as to contour the shape of the double-sided capacitor structures 280 and overlie the top electrode plate 274. In addition, the insulation layer 290 may comprise a similar material as the first ILD layer 200, such as BPSG or the various other insulative materials as previously described herein.

Advantageously, the insulation layer 290 insulates the double-sided capacitor structures 280 from other circuit components either embedded or otherwise located adjacent thereto and provides a means for access to the double-sided capacitor structures 280. In one aspect, generally known vias (not shown) may be formed in the insulation layer 290 to the depth of the upper electrode or top cell plate 274 to thereby provide access thereto. Moreover, the lower electrodes 230 may also be accessed in a similar manner from either the insulation layer 290 or the first ILD layer 200.

The advantage of fabricating double-sided capacitor structures 280 in a manner as previously described herein, with reference to FIGS. 2A–2I, is that unnecessary processing steps and redundant fabrication procedures will be, in this embodiment, reduced from the overall manufacturing process. Beneficially, the present teachings reduce the need for separately etching back the field periphery region 206 and/or the formation and use of sacrificial spacer layers to form the lower electrode 230 of the double-sided capacitor structures 280. In one aspect, standard processing may be used prior to lower electrode 230 deposition for the first conductive layer 220 of conductive material, such as doped polysilicon or TiN, to approximately >150 A in thickness. In addition, after planar processing, using for example CMP or various other etching techniques, a number of resist cleans of an etchant, such as HF, may be used to recess the field periphery region 206 and the common region 210, as illustrated in FIG. 2F. In another aspect of the present teachings, the permeability of the >150 A lower electrodes 230, comprising for example polysilicon or TiN, advantageously allowed the first ILD layer material, for example BPSG, to be removed around the lower electrodes 230 of the double-sided capacitor structures 280, which resulted in the field periphery region 206 being removed with reduced surface topography. By eliminating unnecessary fabrication steps and procedures, an overall reduction in manufacturing costs is achieved. This embodiment prevails in production cost reduction and efficiency.

FIGS. 3A–3I illustrate one embodiment of a method for forming an array of double-sided capacitor structures. It should be appreciated that similar processing, fabrication, and forming techniques as previously described herein with respect to the single capacitor structure 180 of FIGS. 1A–1I and the plurality of capacitor structures 280 of FIGS. 2A–2I may used to form the following array of double-sided capacitor structures of FIGS. 3A–3I without departing from the scope of the present teachings.

Figure 3A:
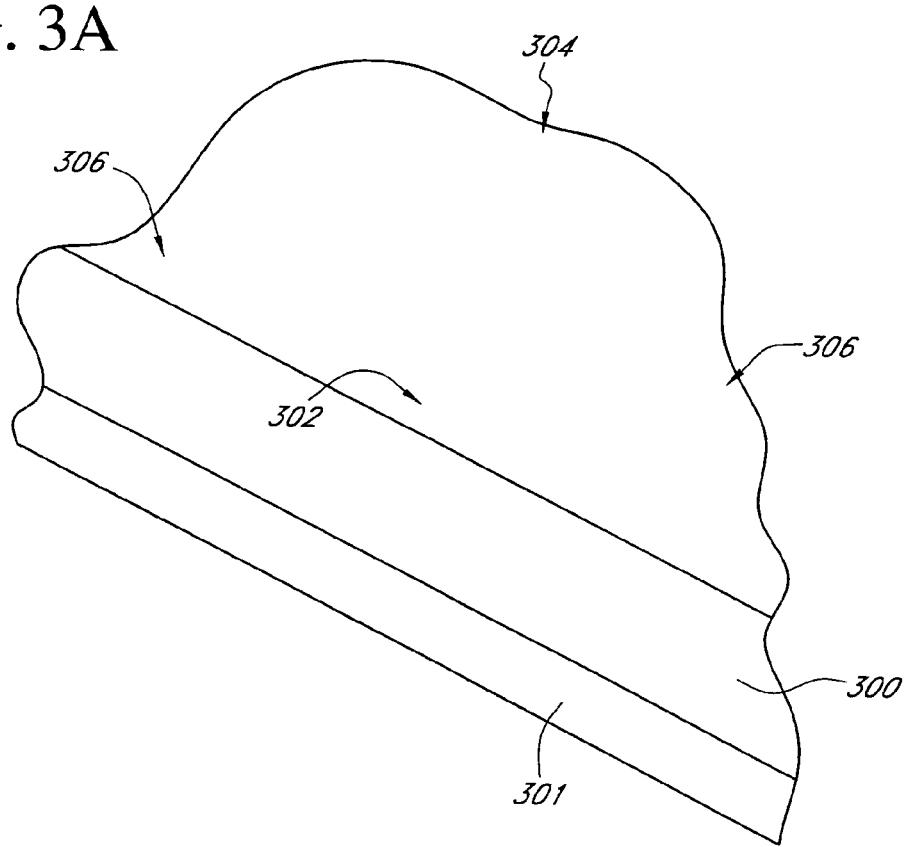
FIGS. 3A–3I illustrate one embodiment of a method for forming an array of double-sided capacitor structures.

In particular, FIG. 3A illustrates one embodiment of at least portion of a first ILD layer 300 deposited on a second ILD layer 301. As illustrated, the first ILD layer 300 may comprise an upper surface 302 and an interior field region 304 adjacent to a periphery field region 306. In one embodiment, the ILD layers 300, 301 may comprise an insulative material, such as BPSG, or other generally known materials, such as PSG, TEOS, silicon, glass, polymer, etc. In addition, the second ILD layer 301 may comprise a plurality of generally known conductive plugs, traces, or contacts (not shown) that are separately formed and abut the first ILD layer 300. Similar to the previous discussions, it should be appreciated that plugs, traces, or contacts (not shown) may be formed to define capacitor node regions (not shown) and may further comprise generally known electrical interconnects between the first ILD layer 300 and one or more circuit components (not shown), such as one or more transistors or various other types of circuit components known in the art.

Moreover, it should be appreciated that the illustrated ILD layers 300, 301 may be similar in scope and function and may comprise similar features and attributes to the ILD layers 100, 101, 200, 201 as previously described with reference to FIGS. 1A and 2A. Therefore, the previous discussions relating to ILD layers 100, 101, 200, 201 in FIGS. 1A–1I and FIG. 2A–2I may be attributed to the ILD layers 300, 301 in FIGS. 3A–3I.

Figure 3B:
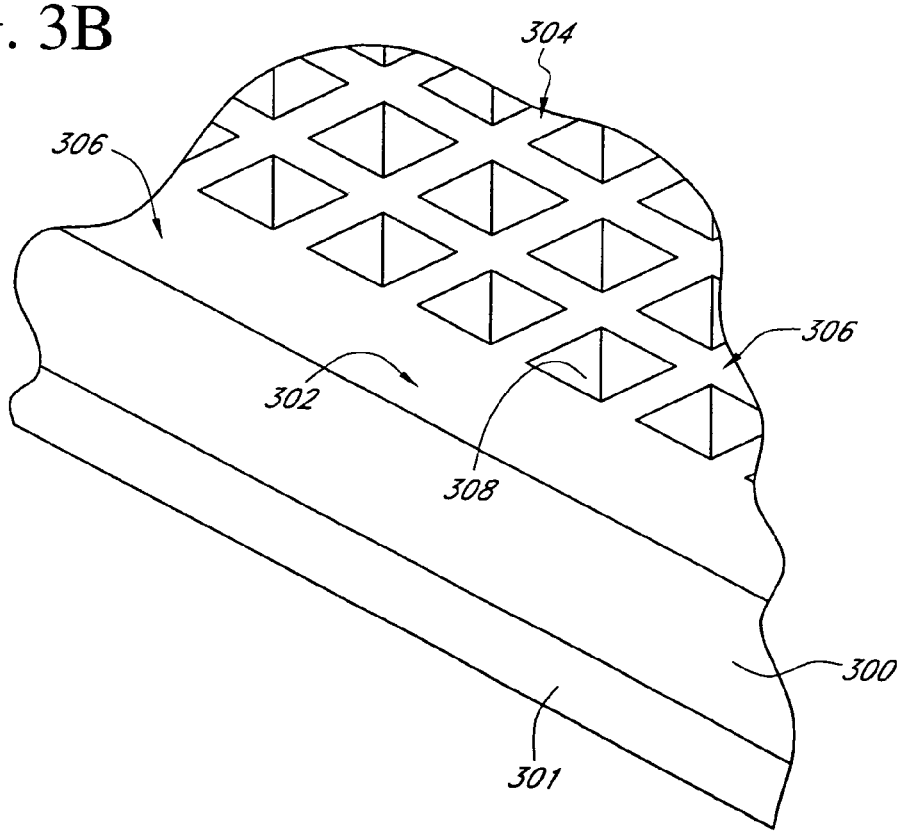
Figure 3C:
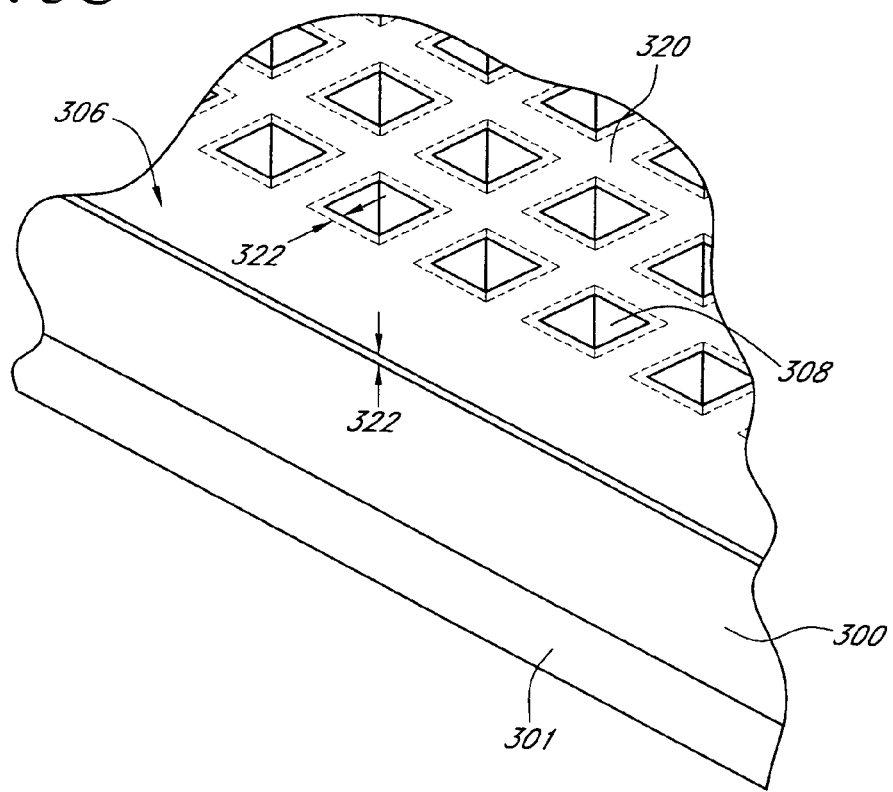
Figure 3D:
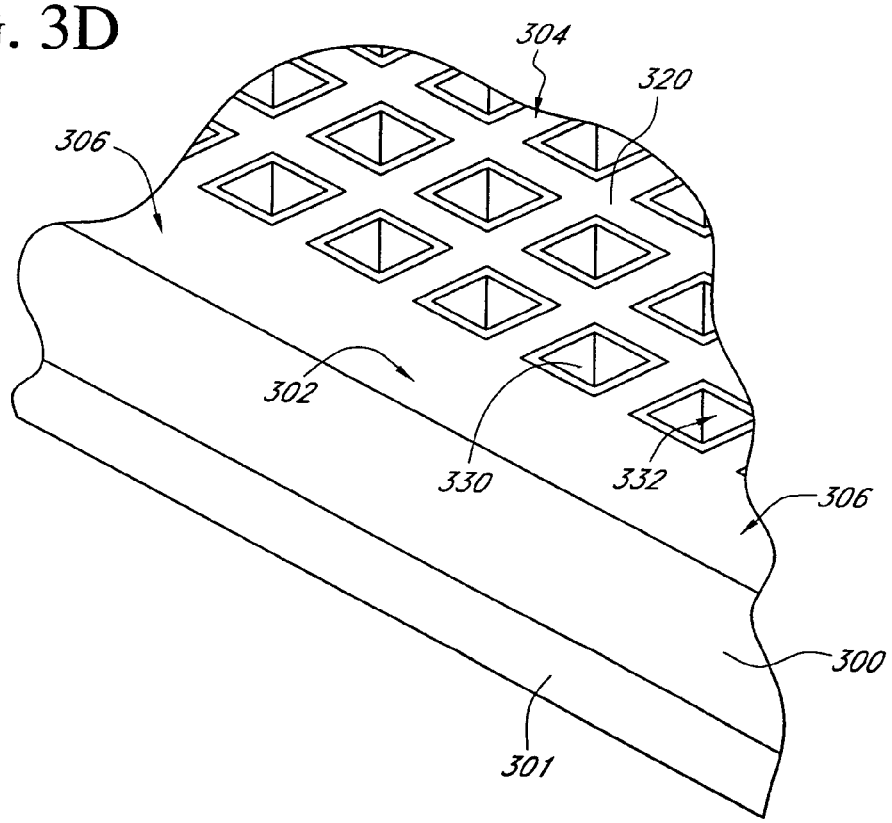

FIG. 3B illustrates the formation of an array of cell containers 308 that may be formed in the interior field region 304 of the first ILD layer 300 such that the periphery field region 306 of the first ILD layer 300 surrounds the array of cell containers 308 in a manner as illustrated in FIG. 3B. FIG. 3C illustrates the conformal deposition of a first conductive layer 320 on the upper surface 302 of the first ILD layer 300 and within the array of cell containers 308. In one embodiment, the first conductive layer 320 may comprise a conductive material, such as polysilicon or TiN, and may be deposited to a thickness 322 of approximately 225 A. In addition, FIG. 3D illustrates the planar etching, using for example a CMP process, of the first conductive layer 320 from the upper surface 302 so as to define an array of lower electrodes 330 within the array of cell containers 208. In one aspect, as previously described, the lower electrodes 330 comprise sidewalls 332 that are formed thin enough to comprise permeable or porous characteristics in a manner as previously described with reference to FIGS. 1D and 2D.

Figure 3E:
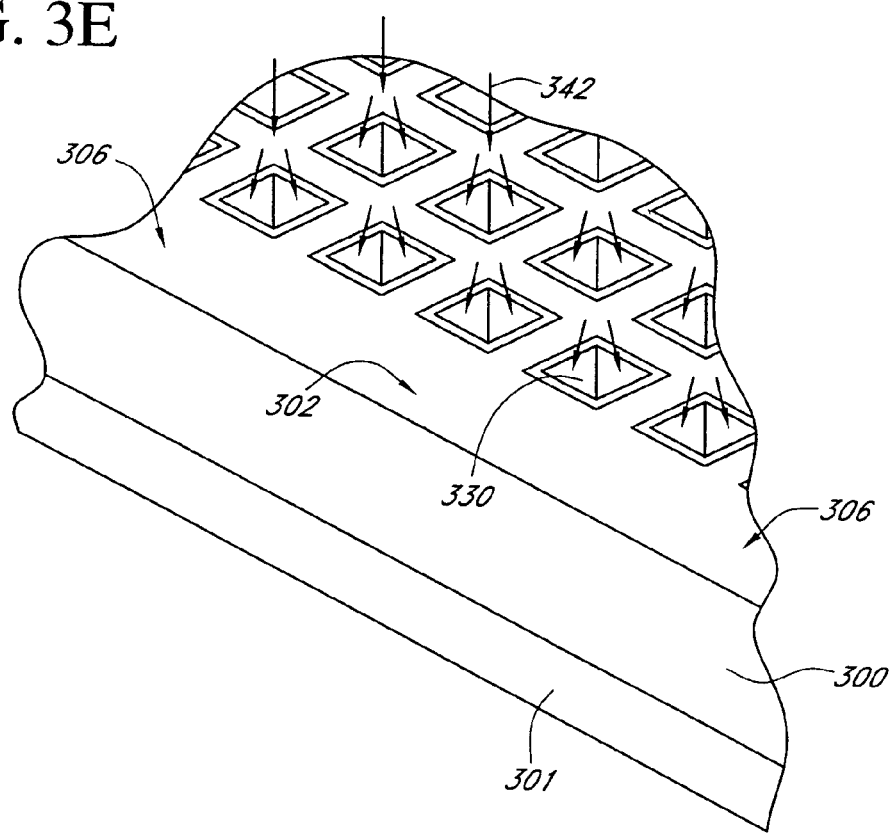
Figure 3F:
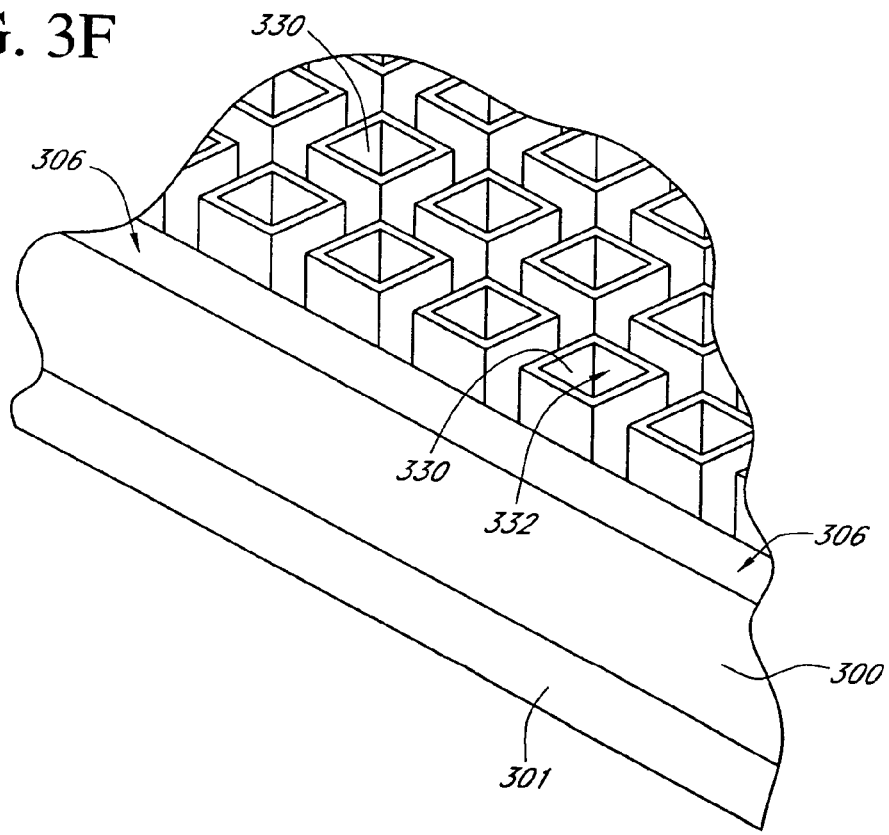

FIG. 3E illustrates the etching of the first ILD layer 300 using an etchant 342, such as HF. As illustrated, the first ILD layer 300 including the lower electrodes 330 are exposed to the etchant 342 in a conformal manner. The etchant 342 advantageously diffuses through the permeable or porous sidewalls 332 of the lower electrodes 330 to thereby etch away the first ILD layer material in contact with the sidewalls 332 of the lower electrodes 330 including the first ILD layer material in between the lower electrodes 330. Advantageously, this process allows the lower electrodes 230 to be free-standing in a manner as illustrated in FIG. 3F. In addition, during etching, the upper surface 302 of the first ILD layer 300 including at least a portion of the periphery field region 306 may be etched down a desired distance. Moreover, as a result of etching through the sidewalls 332 of the lower electrodes 330, the resultant structure of free-standing lower electrodes 330 may be referred to as an array of double-sided containers that will be used to form an array of double-sided capacitor structures as will be described in greater detail herein below.

Figure 3G:
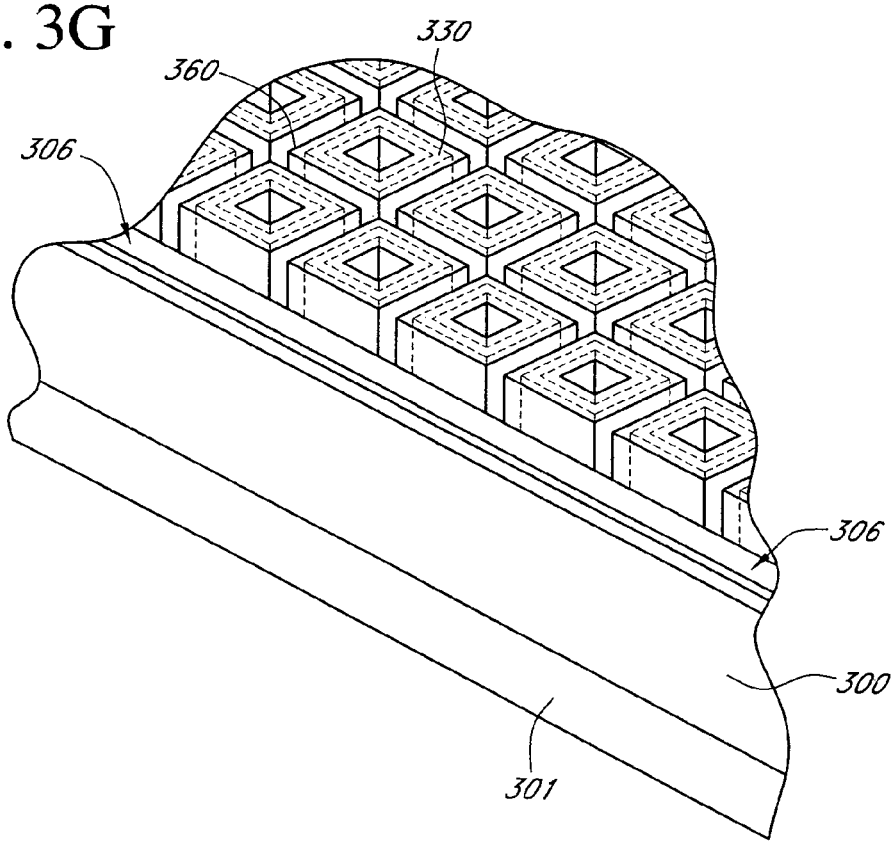
Figure 3H:
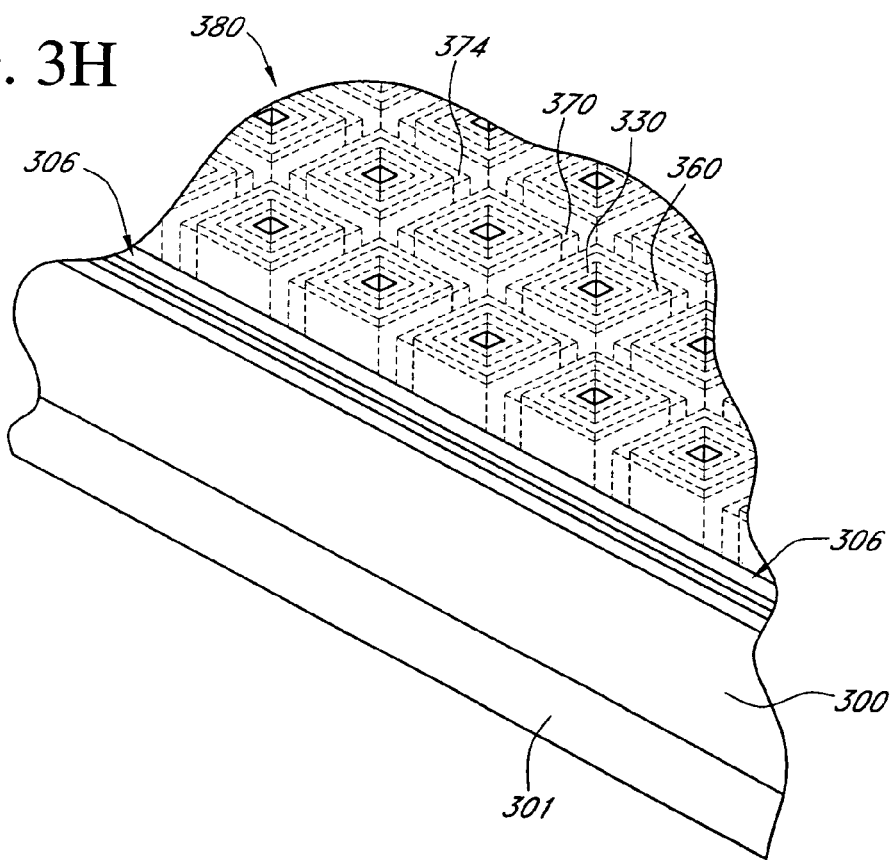

FIG. 3G illustrates the conformal deposition of a dielectric layer 360 on the array of lower electrodes 330. In one aspect, the dielectric layer 360 may be deposited in a manner so as to overlie at least a portion of the field periphery region 306 and the array of lower electrodes 330. FIG. 3H illustrates the conformal deposition of a second conductive layer 370 on the dielectric layer 360 so as to overlie the dielectric layer 360 and the array of lower electrodes 330. In one aspect, the second conductive layer 370 may be deposited in a manner so as to overlie at least a portion of the field periphery region 306, the dielectric layer 360, and the array of lower electrodes 330.

In one embodiment, the second conductive layer 370 defines an upper electrode or top cell plate 374. In addition, the layering of the lower electrodes 330, the dielectric layer 360, and the top cell plate 374 define an array of capacitor structures 380 having double-sided characteristics. Thus, these capacitor structures 380 may also be referred to as double-sided capacitor structures. Advantageously, the double-sided capacitor structures 380 may be used in memory devices, such as DRAM, or various other circuit devices. In one aspect, the capacitor structures 280 are in electrical contact with other circuit components, such as transistors (not shown), via plugs (not shown) formed in the second ILD layer 301. It should be appreciated that these double-sided capacitor structures 380 may also comprise the scope and functionality of the various types of capacitor structures 180, 280 previously described with reference to FIGS. 1G, 2G.

Figure 3I:
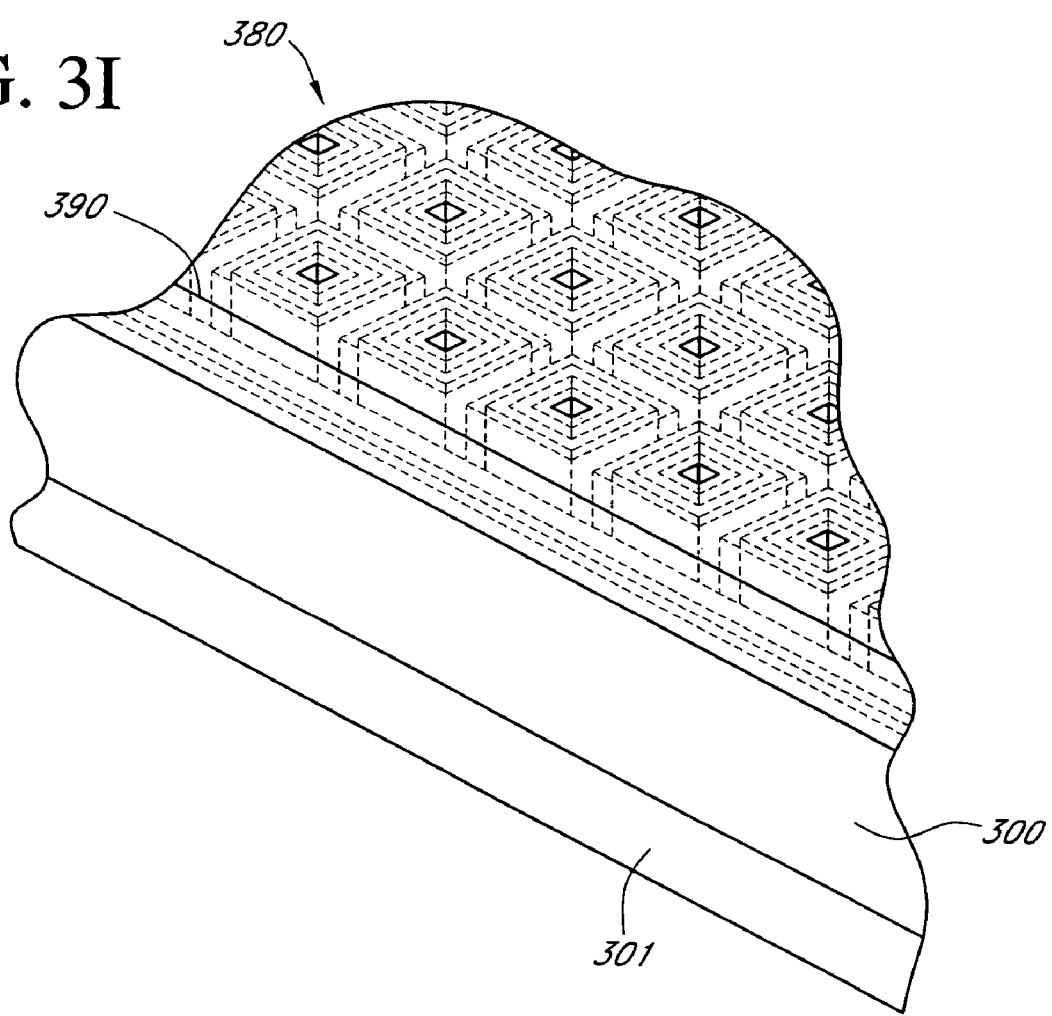

FIG. 3I illustrates the conformal deposition of an insulation layer 390 on the upper surface 302 and the second conductive layer 370. In one embodiment, the insulation layer 390 may be deposited in a manner so as to contour the shape of the capacitor structures 380 and overlie the top electrode plate 374. In addition, the insulation layer 290 may comprise a similar material as the first ILD layer 300, such as BPSG or the various other substrate materials as previously described. Advantageously, the insulation layer 390 insulates the capacitor structures 380 from other circuit components either embedded or otherwise located adjacent thereto and provides a means for access to the capacitor structures 380. In one aspect, generally known vias (not shown) may be formed in the insulation layer 390 to the depth of the upper electrode or top cell plate 374 to thereby provide access thereto.

The advantage of fabricating the array of double-sided capacitor structures 380 in a manner as previously described herein, with reference to FIGS. 3A–3I, is similar in scope to the advantages described with reference to FIGS. 1A–1I and 2A–2I. Beneficially, the permeability of the 150 A polysilicon based lower electrodes 330 advantageously allowed the substrate material, for example BPSG, to be removed around the array of lower electrodes 330 of the double-sided capacitor structures 380, which resulted in the field periphery region 306 and the substrate material 300 in between the lower electrodes 330 to be removed with reduced surface topography. By eliminating unnecessary fabrication steps and procedures, an overall reduction in manufacturing costs is achieved. This embodiment prevails in production cost reduction and efficiency.

Although the foregoing description has shown, described and pointed out the fundamental novel features of the invention, it will be understood that various omissions, substitutions, and changes in the form of the detail of the apparatus as illustrated, as well as the uses thereof, may be made by those skilled in the art, without departing from the spirit or scope of the present teachings. Consequently, the scope of the invention should not be limited to the foregoing discussion, but should be defined by the appended claims.

What is claimed is:

1. A method of forming a capacitor structure on a substrate, the method comprising:

forming a recess in the substrate;

positioning a first conductive layer on the substrate so as to overlie the substrate and the recess;

conformally positioning an etchant on the lower electrode, wherein the etchant diffuses through the lower electrode and etches the substrate away from the lower electrode to thereby at least partially isolate the lower electrode;

depositing a dielectric layer on the isolated lower electrode;

depositing a second conductive layer on the dielectric layer so as to form the upper electrode.

2. The method of claim 1, wherein forming a recess in a substrate comprises forming a recess in an interlayer dielectric layer.

3. The method of claim 2, wherein forming a recess in an interlayer dielectric layer comprises forming a recess in a layer of borophosphosilicate glass (BPSG).

4. The method of claim 1, positioning the first conductive layer on the substrate comprises depositing the first conductive layer to a thickness that is selected to permit etching of the substrate through the lower electrode.

5. The method of claim 4, wherein depositing the conductive layer comprises depositing a layer formed of a material selected from the group consisting of polysilicon, TiN, WSi, and a metal alloy that includes copper, aluminum, silver, gold platinum or rhodium.

6. The method of claim 1, wherein positioning the first conductive layer on the substrate comprises positioning a material onto the substrate that includes impurities which can be selectively removed to result in the lower electrode being porous to etching.

7. The method of claim 6, wherein the first conductive layer is formed of a partially oxidized polysilicon wherein the oxide is selectively removed so as to form the permeable or porous lower electrode.

8. The method of claim 6, wherein the first conductive layer is formed of a doped TiN material wherein the dopant can be selectively removed so as to form the permeable or porous lower electrode.

9. The method of claim 1, wherein conformally positioning an etchant on the lower electrode comprises positioning an HF etchant on the electrode.

10. The method of claim 1, wherein depositing a dielectric layer includes depositing a dielectric material selected from the group consisting of Aluminum-Oxide and Hafnium-Oxide.

11. The method of claim 1, wherein depositing the second conductive layer includes depositing a second conductive material selected from the group consisting of a metal, metal alloy, and a semiconductor including polysilicon, TiN, and WSi.

* * * * *